(12) United States Patent
Kanda et al.

(10) Patent No.: US 6,469,573 B2
(45) Date of Patent: Oct. 22, 2002

(54) SEMICONDUCTOR INTEGRATED CIRCUIT

(75) Inventors: Kazushige Kanda, Kawasaki; Tamio Ikehashi, Kamakura; Ken Takeuchi; Kenichi Imamiya, both of Tokyo-To, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/731,880

(22) Filed: Dec. 8, 2000

(65) Prior Publication Data

US 2001/0033195 A1 Oct. 25, 2001

(30) Foreign Application Priority Data

Dec. 10, 1999 (JP) .............................. 11-351395
Nov. 17, 2000 (JP) ........................................ 2000-351747

(51) Int. Cl.[7] .............................. G05F 1/10; G05F 3/02
(52) U.S. Cl. ........................................ 327/541; 327/536
(58) Field of Search ................................. 327/536, 537, 327/538, 540, 541

(56) References Cited

U.S. PATENT DOCUMENTS 5,444,412 A * 8/1995 Kowalski ..................... 327/540
6,278,316 B1 * 8/2001 Tanzawa et al. ............. 327/536

FOREIGN PATENT DOCUMENTS

JP 09-082895 3/1997

* cited by examiner

Primary Examiner—Terry D. Cunningham
Assistant Examiner—Quan Tra
(74) Attorney, Agent, or Firm—Banner & Witcoff, Ltd.

(57) ABSTRACT

A semiconductor integrated circuit includes a limiter circuit for outputting a voltage determining flag in order to set a boosted voltage level of a booster circuit to be a predetermined value, and a monitoring circuit for monitoring a monitoring node of the limiter circuit to output a monitoring signal for the stabilization of a boosted voltage to a first external terminal. The monitoring circuit detects a first level change of the voltage determining flag from "H" to "L" after the starting of the operation of the limiter circuit, by means of a comparator, to which an external power supply voltage and external reference voltage supplied from second and third external terminals are given, and thereafter, outputs a monitoring signal for holding a constant logical level during the operation of the limiter circuit. In order to provide a voltage trimming function, a voltage intended to be set in an external terminal may be given from the outside to deactivate a feedback system of the limiter circuit to operate a resistance value of the limiter circuit to detect and store a limiter flag. Thus, there is provided a semiconductor integrated circuit capable of simply monitoring the output voltage state of an internal power supply circuit by the external terminal and easily trimming an internal voltage.

10 Claims, 29 Drawing Sheets

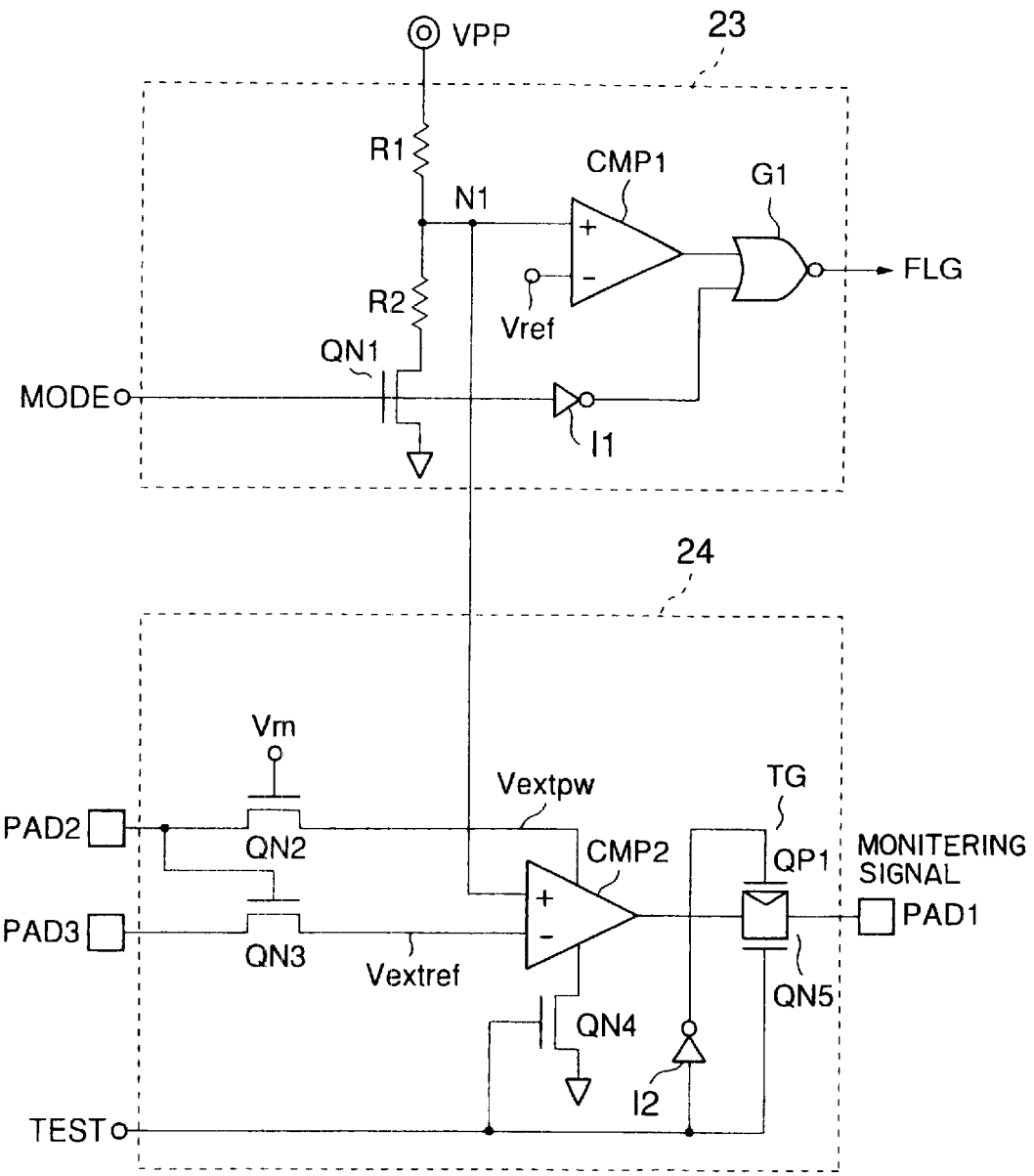
F I G. 11

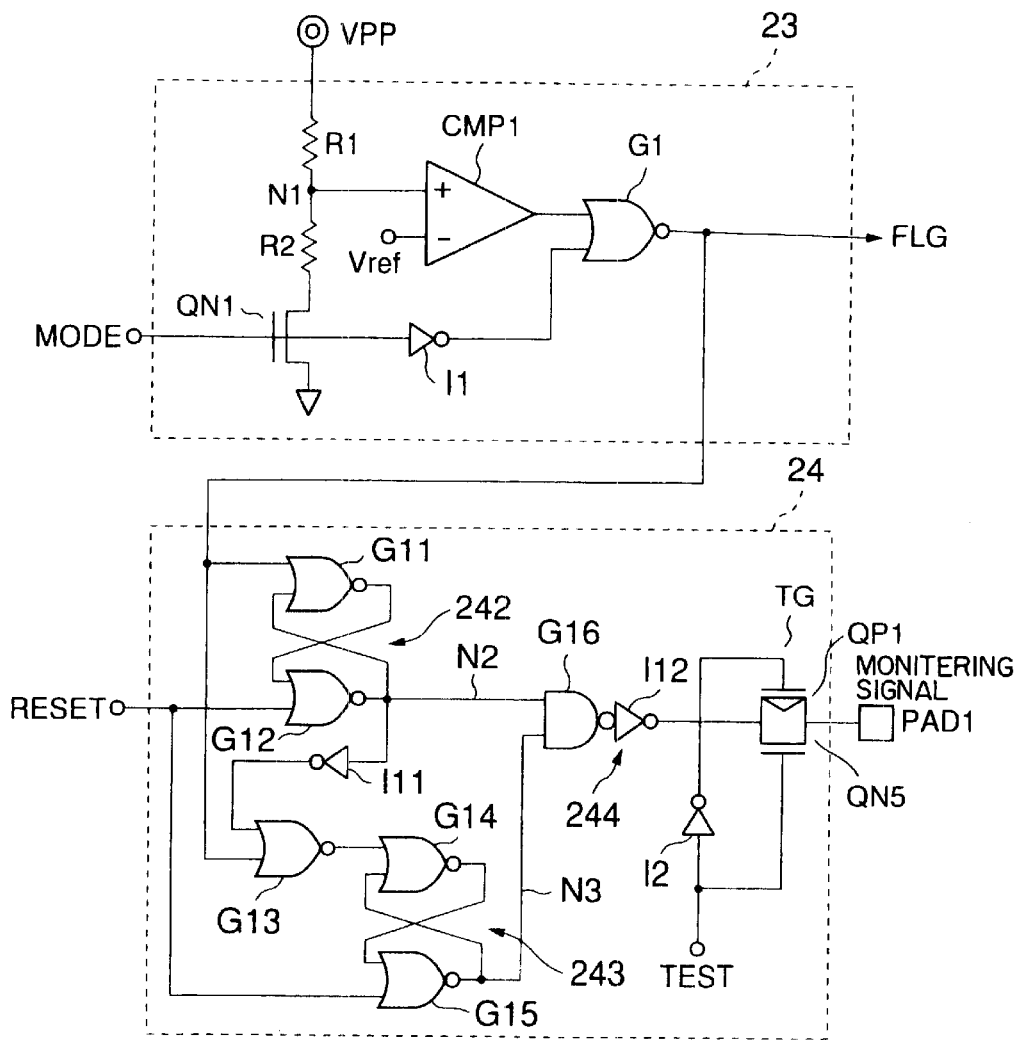
F I G. 17

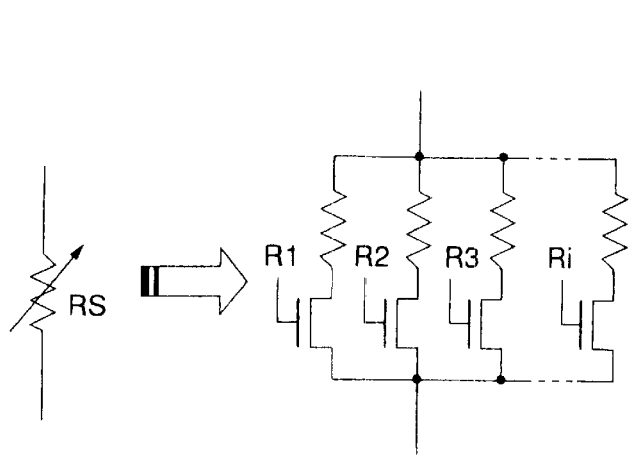
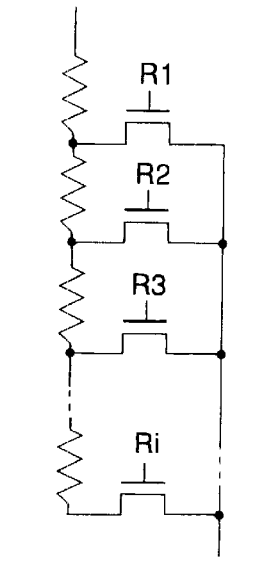
FIG. 23A    FIG. 23B
FIG. 23C
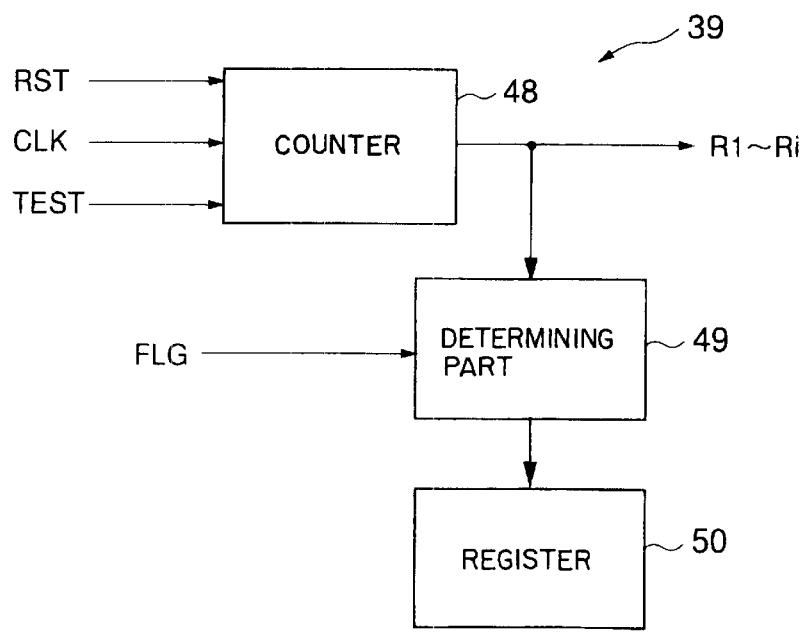
FIG. 24

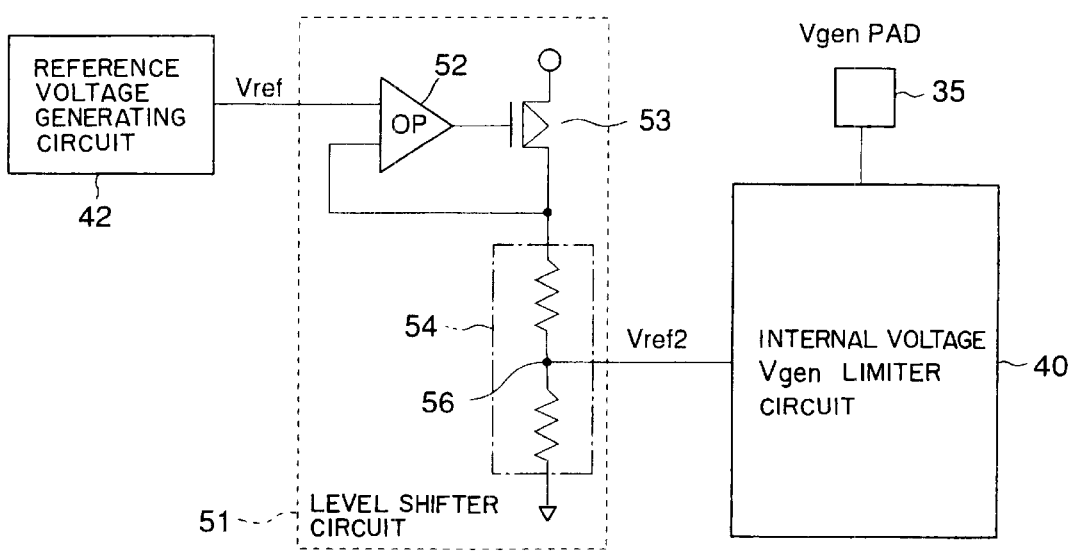
F I G. 26

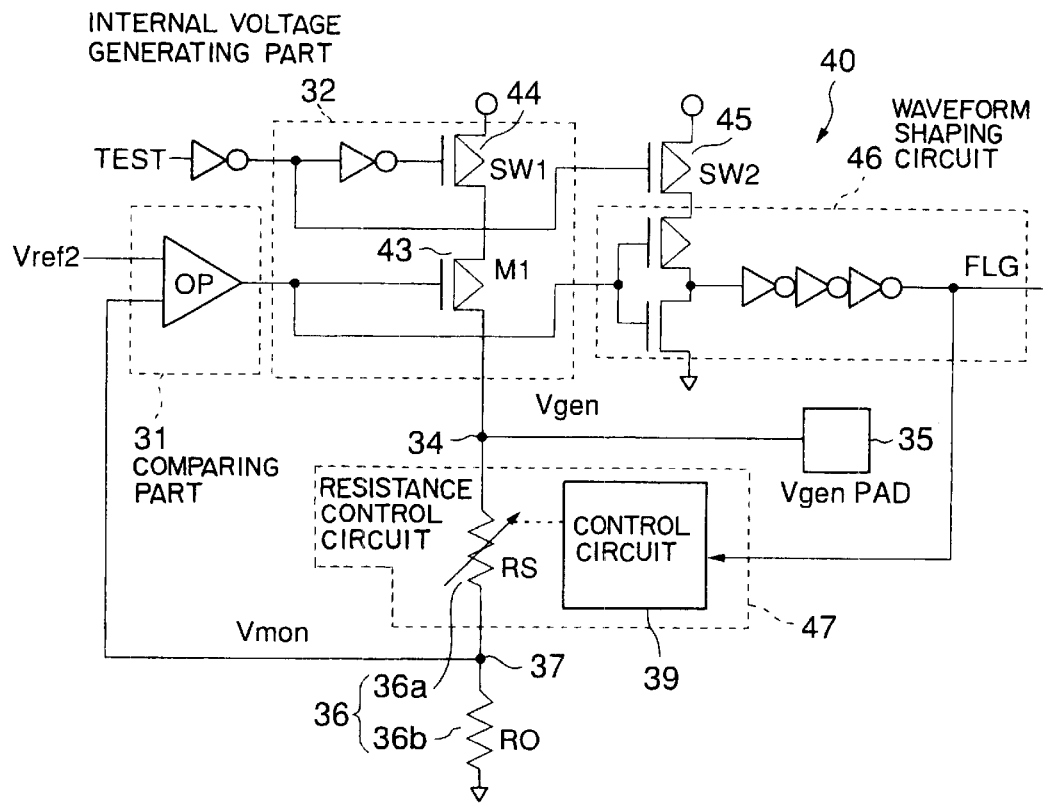
F I G. 27

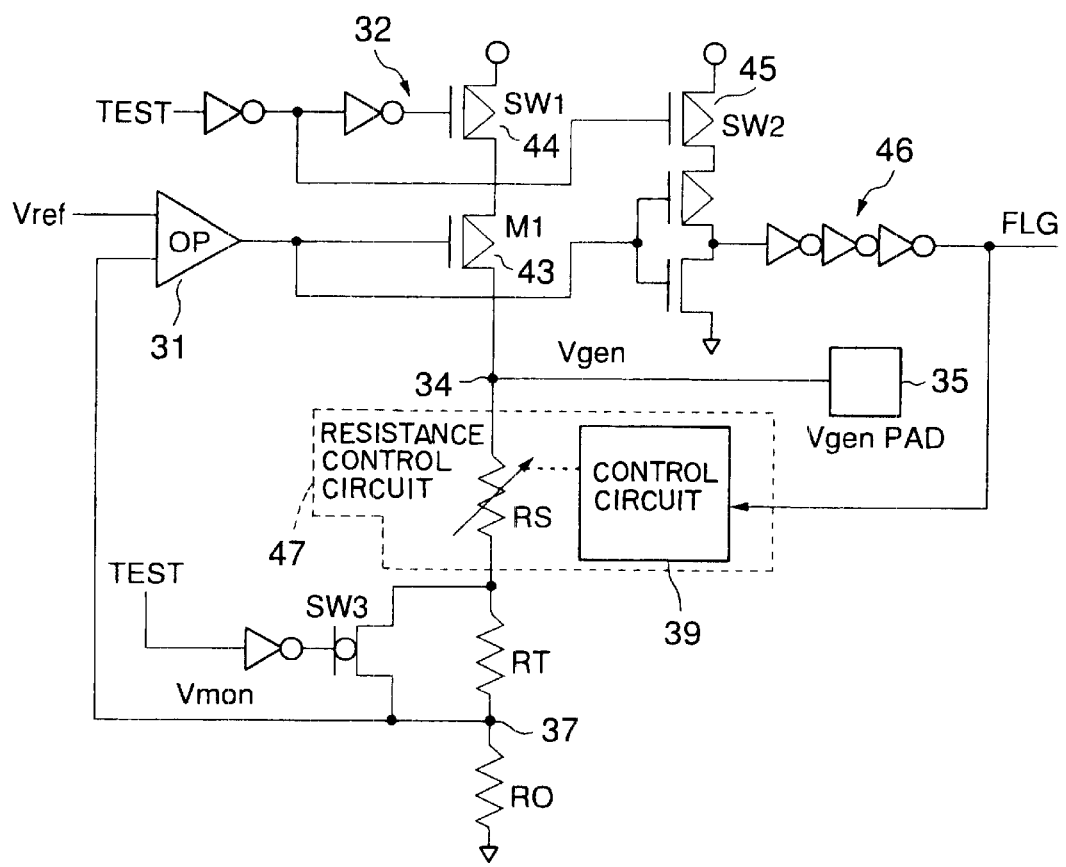
F I G. 30

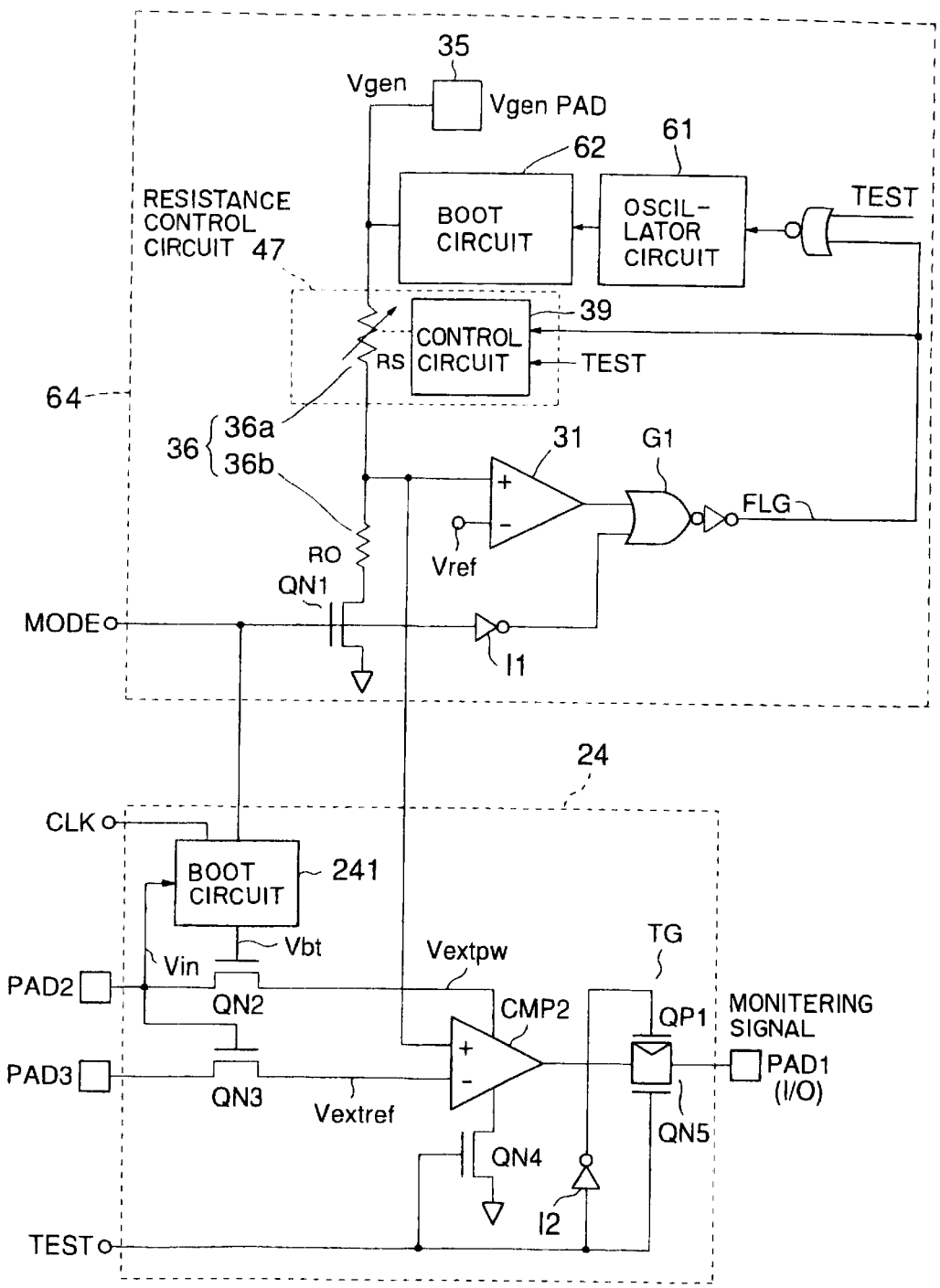
F I G. 35

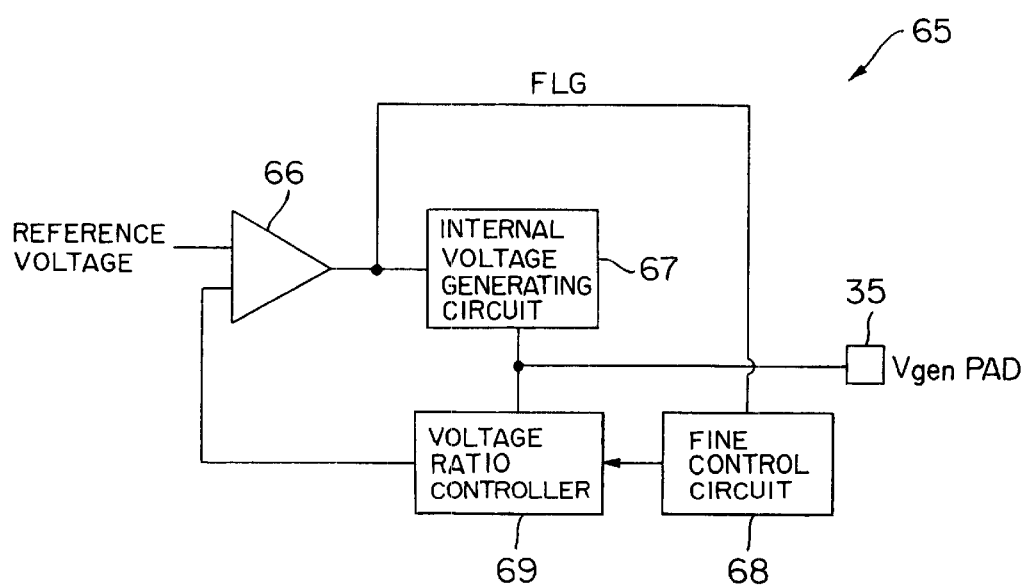
F I G. 36

SEMICONDUCTOR INTEGRATED CIRCUIT

CROSS REFERENCE TO RELATED APPLICATION

This application claims benefit of priority under 35 U.S.C. §119 to Japanese Patent Application No. 1999-269912, filed on Sep. 24, 1999, Japanese Patent Application No. 1999-351395, filed on Dec. 10, 1999, and Japanese Patent Application No. 2000-351747, filed on Nov. 17, 2000, the entire contents of which are incorporated by reference herein.

BACKGROUND OF THE INVENTION

The present invention relates to a semiconductor integrated circuit including an internal power supply circuit, such as a booster circuit for generating a driving voltage which is obtained by shifting the level of a power supply voltage. Moreover, the present invention relates to a semiconductor integrated circuit having a voltage trimming function.

A typical semiconductor memory, such as an EEPROM (Electrically Erasable and Programmable Read Only Memory) or a DRAM (Dynamic Random Access Memory), includes a booster power supply circuit for boosting an internal power supply voltage to generate a required driving voltage. A typical booster power supply circuit comprises: a booster circuit using a charging pump; an oscillator for generating a clock to drive the booster circuit; and a limiter circuit for feedback-controlling the oscillator to set and hold a driving voltage, which is obtained from the booster circuit, to be a predetermined level.

In a die sorting test for such a semiconductor memory in a wafer state, it is measured whether the levels of various voltages, such as a booster power supply output used in an element portion, are designed values, and it is tested whether basic operations, such as writing and erasing operations, can be carried out. In the wafer state, some monitoring pads are usually provided for connecting the wafer to external terminals so that such a voltage test can be carried out.

However, when a memory chip is packaged, most of monitoring pads is not bonding-connected because of a limit to the number of external terminals. Therefore, in order to analyze defective samples on the basis of a stress test and/or a reliability test before shipment, the memory chip is reassembled into a package, which can be bonding-connected to the monitoring pads, so as to be capable of monitoring an internal voltage. This does not only take a lot of time for the defective sample analysis, but also it is impossible to analyze defective places because of a failure occurring in assembly also occur.

In view of the foregoing, there is proposed a test mode function capable of transferring and outputting an output signal (a voltage determining flag), which is obtained from a limiter circuit, such as a booster power supply circuit, to an I/O terminal which is an external terminal, when a test is carried out (Japanese Patent Laid-Open 9-82895). This utilizes that the internal booster power supply circuit or the like has a limiter circuit for controlling its voltage.

However, a voltage determining flag obtained from the limiter circuit is an activating signal for feedback-controlling a booster circuit. For example, as shown in FIG. 18, a voltage determining flag FLG is a logical signal which has "L" before the operation of a booster circuit is started, which has "H" until an output voltage reaches a predetermined level after the operation is started, and which alternately has "H" or "L" after the output is stabilized. Thus, there is a problem in that the voltage determining flag is not suitable for a test using an LSI tester although it is suitable for waveform observation using an oscilloscope or the like. Therefore, it is desired to provide a circuit construction capable of being measured by an LSI tester from the point of view of ease and quick analysis.

SUMMARY OF THE INVENTION

The present invention has been made in view of the above described circumstances, and it is a first object of the present invention to provide a semiconductor integrated circuit capable of simply monitoring the output voltage state of an internal power supply circuit by an external terminal.

It is a second object of the present invention to provide a semiconductor integrated circuit having a voltage trimming function capable of applying a voltage, which is intended to be set in a voltage monitoring pad, from the outside to deactivate a feedback system of a limiter circuit in order to operate the value of resistance of the limiter circuit to read a limiter flag so as to carry out a voltage trimming.

In order to accomplish the above described first object, a semiconductor integrated circuit according to a first basic construction of the present invention comprises: an internal power supply circuit for generating a driving voltage which is obtained by shifting the level of a power supply voltage; a limiter circuit, which is operated by the input of a mode signal, for monitoring the driving voltage which is outputted from the internal power supply circuit, and for outputting an activating signal which has a first logical level until the driving voltage reaches a predetermined value and which has a second logical level after the driving voltage reaches the predetermined value, to activate and control the internal power supply circuit; and a monitoring circuit for detecting a first change of the activating signal from the first logical level to the second logical level after the operation of the limiter circuit is started, and for outputting a monitoring signal having a constant logical level while the limiter circuit operates after the first change of the activating signal is detected.

According to the first basic construction of the semiconductor integrated circuit, the monitoring circuit for outputting the monitoring signal, which has the constant logical level, after the timing in stabilizing the output of the internal power supply circuit, is added to the internal power supply circuit. If the monitoring signal is transmitted and outputted to the external terminal in a test mode, the output of the internal power supply circuit can be simply confirmed by an LSI tester, unlike a case where the output of the limiter circuit, which alternately has "H" or "L" after stabilizing the output, is directly monitored.

In the semiconductor integrated circuit according to the first basic construction, there may be provided a first construction of a semiconductor integrated circuit wherein the monitoring circuit is activated in a test mode, and the monitoring signal is transferred and outputted to a first external terminal.

In the semiconductor integrated circuit according to the first basic construction, there may be provided a second construction wherein the monitoring circuit comprises: a comparator, to which an external power supply voltage supplied from a second external terminal is given and which is activated in the test mode, for comparing a voltage of a monitoring node, which is provided for monitoring the driving voltage of the internal power supply circuit, with a reference voltage, which is supplied from a third external terminal, for outputting the monitoring signal; and a transfer gate for transferring the monitoring signal, which is outputted from the comparator, to the first external terminal.

In the semiconductor integrated circuit according to the second construction, the reference voltage supplied from the third external terminal may be a voltage, the level of which varies with the elapse of time so as to cross a voltage value which is to be monitored by the monitoring node.

In the semiconductor integrated circuit according to the second construction, a transfer gate driven by a boosted voltage may be provided in a path for supplying the external power supply voltage from the second external terminal to the comparator.

In the semiconductor integrated circuit according to the second construction, a transfer gate driven by the external power supply voltage or a voltage boosted therein may be provided in a path for supplying a reference voltage from the third external terminal to the comparator.

In the semiconductor integrated circuit according to the first construction, there may be provided a third construction wherein the monitoring circuit comprises: a comparator, to which an external power supply voltage supplied from a second external terminal is given and which is activated in the test mode, for comparing a voltage of a monitoring node, which is provided for monitoring the driving voltage of the internal power supply circuit, with a reference voltage, which is obtained by potential-dividing the external power supply voltage, for outputting the monitoring signal; and a transfer gate for transferring the monitoring signal, which is outputted from the comparator, to the first external terminal.

In the semiconductor integrated circuit according to the third construction, the external power supply voltage supplied from the second external terminal may be a voltage, the level of which varies with the elapse of time so as to cross a voltage value which is to be monitored by the monitoring node.

In the semiconductor integrated circuit according to the third construction, a transfer gate driven by a boosted voltage may be provided in a path for supplying the external power supply voltage from the second external terminal to the comparator.

In the semiconductor integrated circuit according to the first construction, there may be provided a fourth construction wherein the monitoring circuit comprises: a comparator, activated in the test mode, for comparing a voltage of a monitoring node, which is provided for monitoring the driving voltage of the internal power supply circuit, with a reference voltage, which is supplied from a third external terminal, for outputting the monitoring signal; and a transfer gate for transferring the monitoring signal, which is outputted from the comparator, to the first external terminal.

In the semiconductor integrated circuit according to the fourth construction, the reference voltage supplied from the third external terminal may be a voltage, the level of which varies with the elapse of time so as to cross a voltage value which is to be monitored by the monitoring node.

In the semiconductor integrated circuit according to the fourth construction, a transfer gate driven by an external power supply voltage or a voltage boosted therein may be provided in a path for supplying a reference voltage from the third external terminal to the comparator.

In the semiconductor integrated circuit according to the first construction, the monitoring circuit may comprise: a first latch circuit for detecting and holding a change of the activating signal to the first logical level immediately after an operation starts; a second latch circuit for detecting and holding a first change of the activating signal to the second logical level after the operation starts; and a gate circuit for obtaining the monitoring signal by a logical product of data held by the first and second latch circuits.

The semiconductor integrated circuit according to the first basic construction may further comprise: a comparing part for comparing a predetermined voltage with a reference voltage; an internal voltage generating part for generating an internal voltage on the basis of an output of the comparing part; and a divided resistance part for potential-dividing into the predetermined voltage by dividing an internal voltage node with resistance, the semiconductor integrated circuit having a test mode for determining an internal resistance value by supplying a desired trimming voltage from the outside to an external terminal connected to a first node which is an node between the internal voltage generating part and the divided resistance part, deactivating a feedback to the internal voltage generating part by the output of the comparing part, and detecting a compared result which is the output of the comparing part, in order to set the internal resistance value so as to be a desired voltage. Such a construction is a combination of the first basic construction with a second basic construction which will be described below.

In order to accomplish the above described second preferred embodiment, a semiconductor integrated circuit according to a second basic construction of the present invention comprises: a comparing part for comparing a predetermined voltage with a reference voltage; an internal voltage generating part for generating an internal voltage on the basis of an output of the comparing part; and a divided resistance part for potential-dividing into the predetermined voltage by dividing an internal voltage node with resistance, the semiconductor integrated circuit having a test mode for determining an internal resistance value by supplying a desired trimming voltage from the outside to an external terminal connected to a first node which is an node between the internal voltage generating part and the divided resistance part, deactivating a feedback to the internal voltage generating part by the output of the comparing part, and detecting a compared result which is the output of the comparing part, in order to set the internal resistance value so as to be a desired voltage.

According to the second basic construction of the semiconductor integrated circuit, a voltage intended to be set in the voltage monitoring pad can be given from the outside to carry out a voltage trimming by the deactivation of the feedback system of the limiter circuit, the operation of the value of resistance of the limiter, and the readout of the limiter flag.

The semiconductor integrated circuit according to the second basic construction may further comprise a first reference voltage generating part for generating a reference voltage for the whole chip.

The semiconductor integrated circuit according to the second basic construction may further comprise a second reference voltage generating circuit for generating a second reference voltage, which is stepped down by level-shifting the first reference voltage, when a first reference voltage, which is a reference voltage for the whole chip, is higher than the trimming voltage which is supplied from the external terminal.

In the semiconductor integrated circuit according to the second basic construction, the internal voltage generating part may comprise: when the internal voltage is higher than a power supply voltage, an oscillator circuit which is operated by an activating signal which is outputted; a booster circuit for outputting a boosted voltage, which is boosted in response to a pulse outputted from the oscillator circuit, to the first node; and a control part for controlling a change of the oscillator circuit between activation and deactivation by a compared result, which is outputted from the comparing part, by the desired trimming voltage which is supplied from the external terminal in the test mode.

In the semiconductor integrated circuit according to the second basic construction, the internal voltage generating part may comprise: when the internal voltage is higher than a power supply voltage an oscillator circuit operated by an activating signal which is outputted; a booster circuit for outputting a boosted voltage, which is boosted in response to a pulse outputted from the oscillator circuit, to the first node; and a control part for controlling a change of the booster circuit between activation and deactivation by a compared result, which is outputted from the comparing part, by the desired trimming voltage which is supplied from the external terminal in the test mode.

In the semiconductor integrated circuit according to the second basic construction, the divided resistance part may include a variable resistor for varying a value of resistance on the basis of the compared result in the test mode, the divided resistance part previously setting a set level of the trimming voltage, which is supplied from the external terminal, to be a predetermined step width, and shifting the step width upwards or downwards by a half step during a trimming test to control the set level with the precise of the half step.

A semiconductor integrated circuit according to a third basic construction of the present invention has a function capable of generating an internal voltage by comparison with a reference voltage and fine-controlling an internal voltage value by bit data, the semiconductor integrated circuit comprising means for supplying a first voltage from the outside to an output node of an internal voltage generating circuit during a test, detecting bit data wherein a voltage ratio of an internal voltage value to a reference voltage is closest to a voltage ratio of the first voltage to a reference voltage, and fine-controlling an internal voltage in accordance with bit data during an operation other than the test.

In the semiconductor integrated circuit according to the third basic construction, the semiconductor integrated circuit according to the second basic construction is realized by a functional construction. Also by the semiconductor integrated circuit according to the third basic construction, a voltage intended to be set can be given from the outside to carry out a test, and bit data can be read during an operation other than the test to carry out a voltage trimming so as to fine-control the internal voltage.

BRIEF DESCRIPTION OF THE DRAWINGS

In the drawings:

FIG. 11 is a circuit diagram showing a limiter circuit and a monitoring circuit in the third preferred embodiment of a semiconductor integrated circuit according to the present invention;

FIG. 17 is a circuit diagram showing a limiter circuit and a monitoring circuit in the eighth preferred embodiment of a semiconductor integrated circuit according to the present invention;

FIG. 23A is a circuit diagram of a variable resistor RS, and FIGS. 23B and 23C are circuit diagrams showing detailed constructions thereof;

FIG. 24 is a block diagram showing a detailed construction of a control circuit 39 of a resistance control circuit 47;

FIG. 26 is a circuit block diagram of a level shifter circuit in the eleventh preferred embodiment of a semiconductor integrated circuit according to the present invention;

FIG. 27 is a circuit block diagram of the eleventh preferred embodiment of a semiconductor integrated circuit according to the present invention;

FIG. 30 is a circuit block diagram of the thirteenth preferred embodiment of a semiconductor integrated circuit according to the present invention;

FIG. 35 is a circuit block diagram of the eighteenth preferred embodiment of a semiconductor integrated circuit according to the present invention; and FIG. 36 is a block diagram of the nineteenth preferred embodiment of a semiconductor integrated circuit according to the present invention.

DESCRIPTION OF THE PREFERRED EMBODIMENTS

Referring now to the accompanying drawings, the preferred embodiments of the present invention will be described below. Of the preferred embodiments disclosed in the specification, the first through eighth preferred embodiments discloses the details of a first basic construction of the present invention, and the ninth through nineteenth preferred embodiments discloses the details of a second basic construction of the present invention.

(First Preferred Embodiment)

Figure 1:
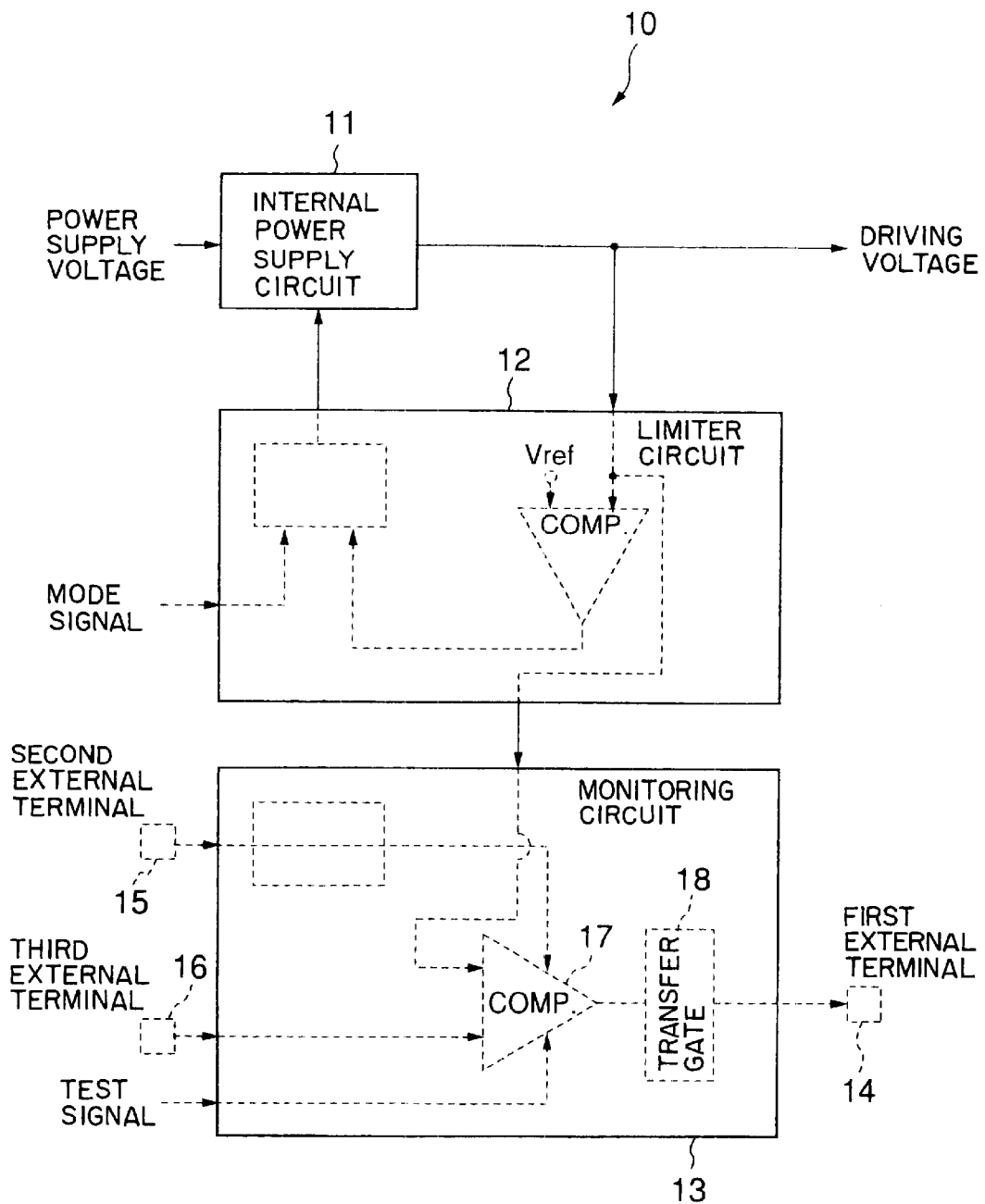
FIG. 1 is a block diagram schematically showing the first preferred embodiment of a semiconductor integrated circuit according to the present invention, which serves as a basic concept of the present invention.

The first preferred embodiment includes the most basic concept of the first basic construction of the present invention, and the basic construction thereof is shown in FIG. 1. The first preferred embodiment of a semiconductor integrated circuit according to the present invention, which is shown in FIG. 1, corresponds to the super-ordinate concept of the second through eighth preferred embodiments of the present invention. In FIG. 1, the semiconductor integrated circuit 10 in the first preferred embodiment comprises: an internal power supply circuit 11 for generating a driving voltage which is obtained by shifting the level of a power supply voltage; a limiter circuit for controlling the activation of the internal power supply circuit 11 by starting to operate in response to the input of a mode signal to monitor the driving voltage which is outputted from the internal power supply circuit 11, holding a first logical level until the driving voltage reaches a predetermined value, and outputting an activating signal having a second logical level after the driving voltage reaches the predetermined value; and monitoring circuit 13 for detecting that the level of the activating signal is first changed from the first logical level to the second logical level after the operation of the limiter circuit 12 is started, and thereafter, for outputting a monitoring signal for holding a constant logical level while the limiter circuit 12 is operating.

In FIG. 1, the feature of the present invention resides in proving not only the limiter circuit 12, but also the monitoring circuit 13. The monitoring circuit 13 comprises: a first external terminal 14 for outputting a monitoring signal; a second external terminal 15, to which a power supply voltage is supplied from the outside; and a third external terminal 16, to which a reference voltage compared with the voltage of a monitoring node for monitoring a driving voltage is supplied. The monitoring circuit 13 further comprises: a comparator 17, activated during a test mode, for comparing the voltage of the monitoring node for monitoring the driving voltage of the internal power supply circuit, with the reference voltage, which is supplied from the third external terminal 16, to output a monitoring signal; and a transfer gate 18 for transferring the monitoring signal, which is outputted from the comparator 17, to the first external terminal 14. The detailed constructions of the limiter circuit 12 and monitoring circuit 13 will be described in the second through eighth preferred embodiments which will be described later.

Figure 2:
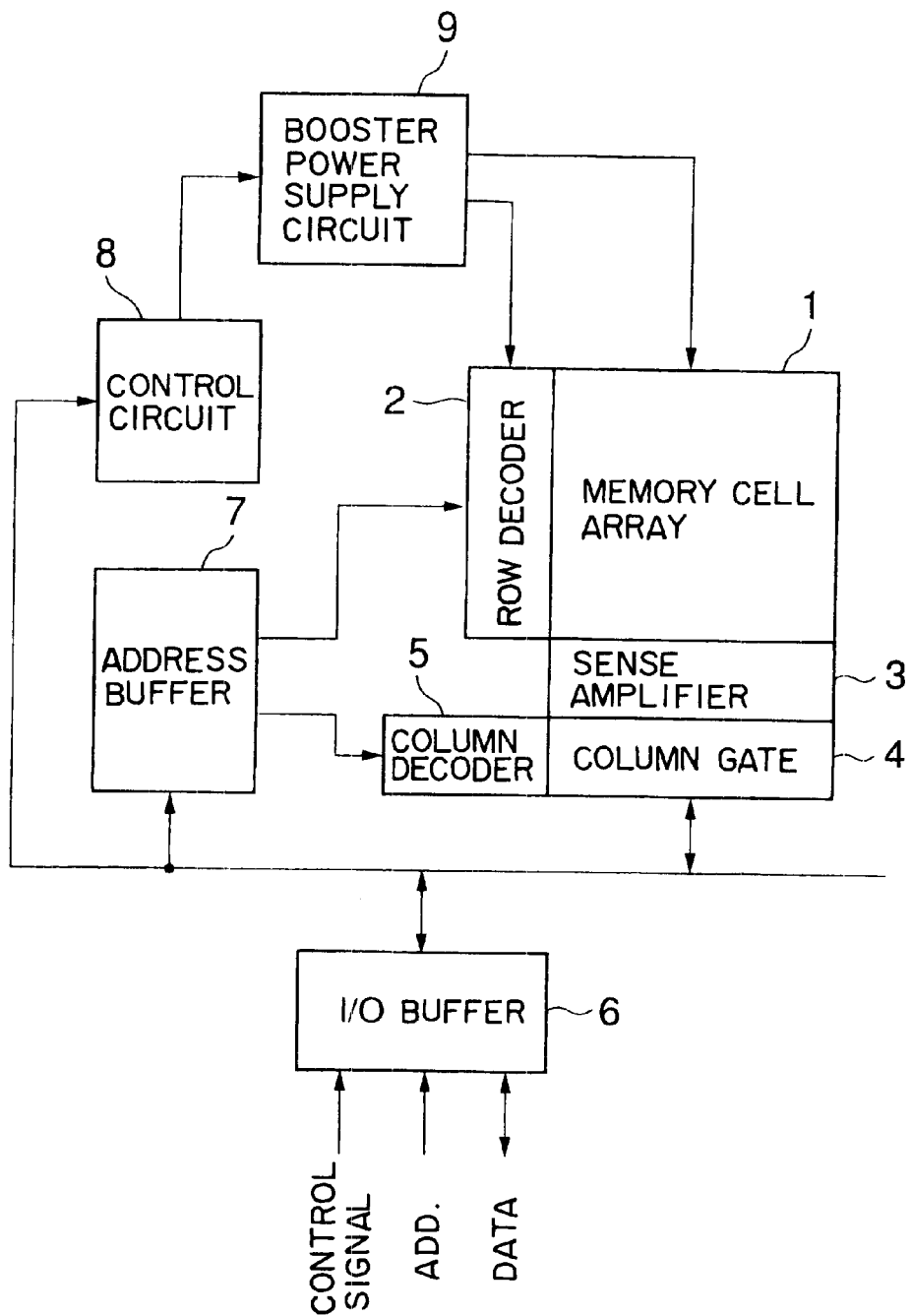
FIG. 2 is a block diagram showing an EEPROM, to which any one of the first through eighth preferred embodiments of a semiconductor integrated circuit according to the present invention is applied.

With this construction, the semiconductor integrated circuit 10 in the first preferred embodiment is mounted on an EEPROM as shown in FIG. 2. Referring to FIG. 2, the construction of an EEPROM, to which the present invention is applied, will be described. In FIG. 2, a memory cell array 1 comprises, e.g., NAND or NOR type nonvolatile memory cells. The word lines of the memory cell array 1 are selectively driven by a row decoder 2, and the bit lines of the memory cell array 1 are selected by a column decoder 5 and a column gate 4. During a read operation, the bit line data of the memory cell array 1 are detected and amplified by a sense amplifier 3 to be selected by the column gate 4 to be transferred to an I/O buffer 6. During a write operation, write data are given from the outside to the bit lines via the column gate 4 and the sense amplifier 3.

Address signals ADD. and various control signals are also incorporated into the I/O buffer 6. Then, the address signals are transferred to an address buffer 7 to be held therein, and the control signals are transferred to a control circuit 8. The control circuit 8 controls the address buffer 7 in accordance with an operation mode, which is set by the control signals, to transfer row and column addresses to the row decoder 2 and the column decoder 5, respectively, and controls a booster power supply circuit 9 in accordance with the operation mode to carry out a sequence control for automatic write and automatic erase. The booster power supply circuit 9 is designed to generate a write, erase or intermediate voltage which are given to the respective portion of the memory cell array 1 and which are obtained by boosting a power supply voltage. One power supply circuit included in the booster power supply circuit 9 corresponds to the semiconductor integrated circuit 10 of FIG. 1.

(Second Preferred Embodiment)

Referring to FIGS. 3 through 10, the second preferred embodiment of a semiconductor integrated circuit according to the present invention, which serves as a more detailed construction of the present invention, will be described below. It is assumed that the EEPROM of FIG. 2 may be applied to the second preferred embodiment.

Figure 3:
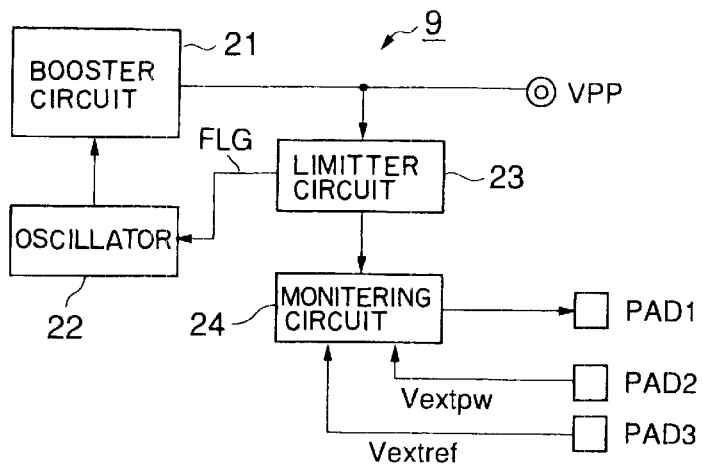
FIG. 3 is a block diagram of a booster power supply circuit in the second preferred embodiment of a semiconductor integrated circuit according to the present invention.

FIG. 3 shows the construction of a power supply circuit for generating a high voltage VPP as one power supply circuit included in the booster power supply circuit 9. The power supply circuit body comprises a booster circuit 21 comprising a charging pump circuit, and an oscillator 22 for generating a clock for driving the booster circuit 21. The output terminal of the booster circuit 21 is provided with a limiter circuit 23 for monitoring the output voltage of the booster circuit 21 to hold it at a predetermined level. The limiter circuit 23 is designed to output a voltage determining flag FLG in accordance with the state of the output voltage in the operation state of the booster circuit. The voltage determining flag FLG serves as an activating signal for controlling the activation and deactivation of the oscillator 22.

A monitoring circuit 24 for detecting the voltage of a predetermined node of the limiter circuit 23 is provided so that the state of the voltage determining flag FLG outputted from the limiter circuit 23 can be monitored from the outside of the chip. A terminal for monitoring signals outputted from the monitoring circuit 24 is connected to a pad PAD1 which is bonding-connected to an external terminal. In this preferred embodiment, terminals for supplying an external power supply voltage Vetpw and an external reference voltage Vextref to the monitoring circuit 24 are also connected to pads PAD2 and PAD3, respectively.

Figure 4:
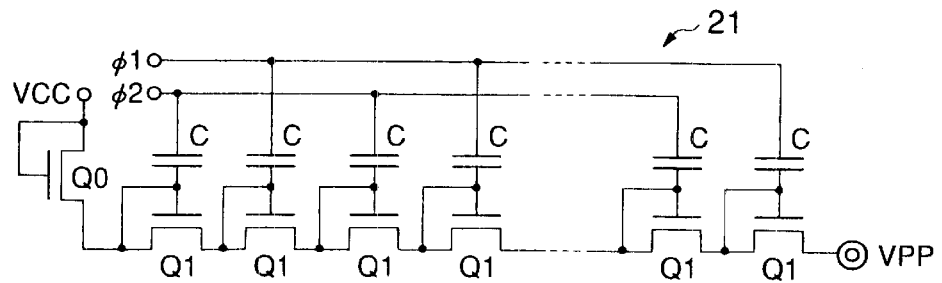
FIG. 4 is a circuit diagram showing an example of a detailed construction of a booster circuit of FIG. 3.
Figure 5:
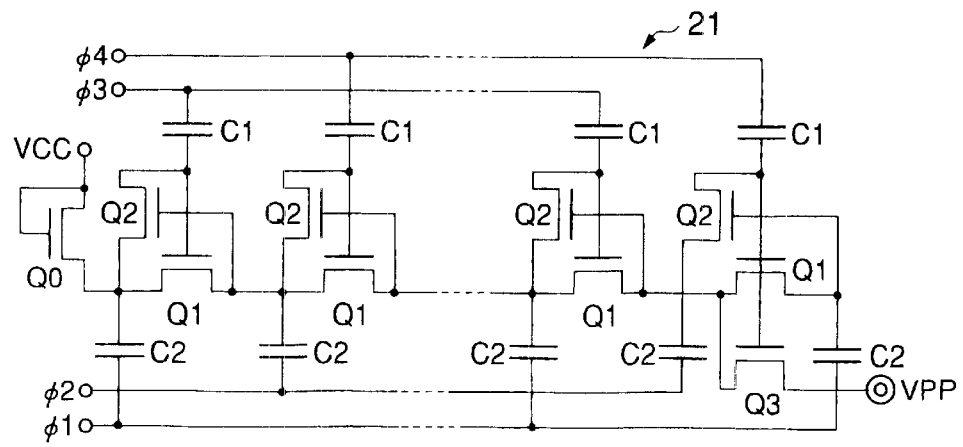
FIG. 5 is a circuit diagram showing another example of a detailed construction of a booster circuit of FIG. 3.
Figure 6:
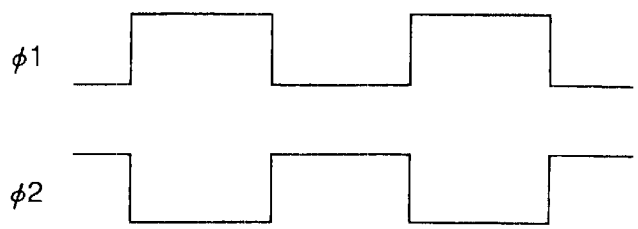
FIG. 6 is a characteristic diagram showing a clock waveform of the booster circuit of FIG. 4.
Figure 7:
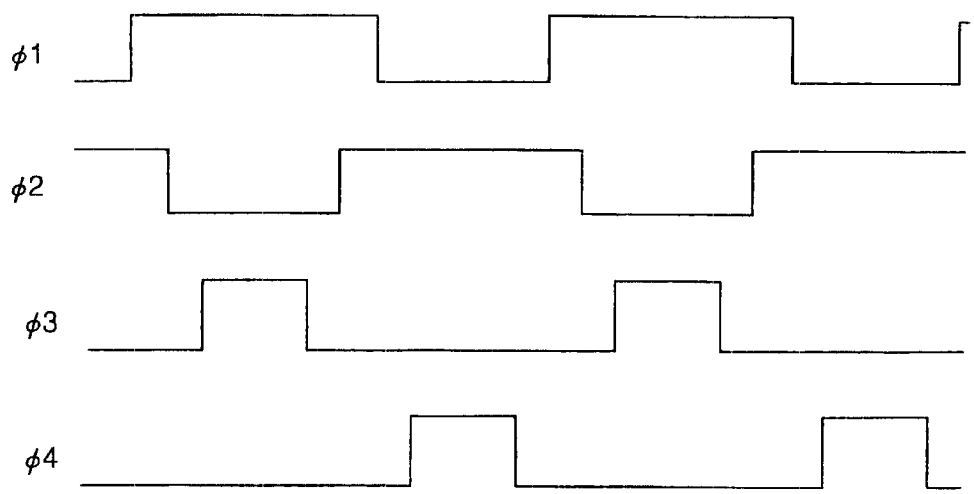
FIG. 7 is a characteristic diagram showing a clock waveform of the booster circuit of FIG. 5.

As the booster circuit 21, a two-phase driven charging pump circuit shown in FIG. 4 or a quadri-phase driven charging pump circuit shown in FIG. 5 is used. These circuits are well known, and the descriptions thereof are omitted. The booster circuit shown in FIG. 4 is driven by two-phase clocks φ1 and φ2 which are generated from the oscillator 22 and which are shown in FIG. 6, and the booster circuit shown in FIG. 5 is driven by quadri-phase clocks φ1 through φ4 shown in FIG. 7, for generating a high voltage VPP which is obtained by boosting a power supply voltage VCC.

Figure 8:
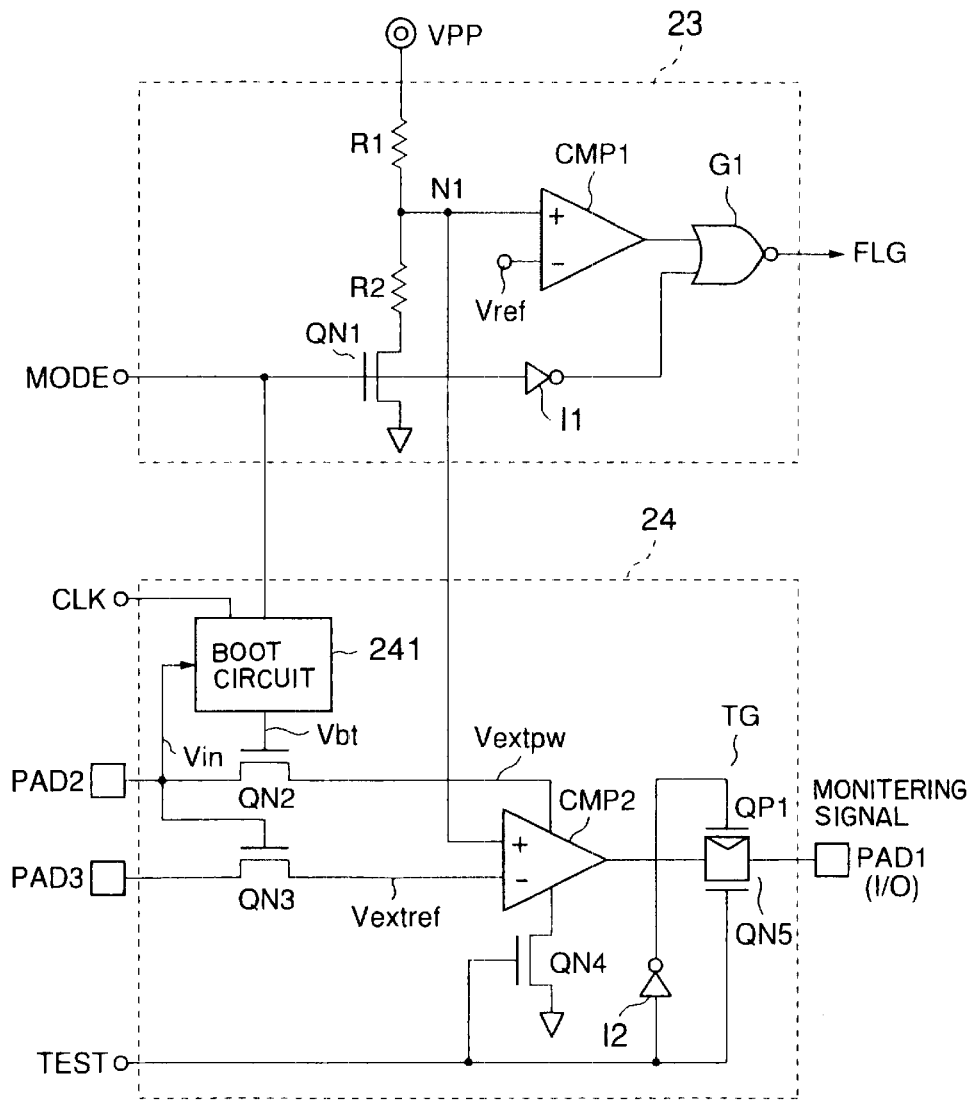
FIG. 8 is a circuit diagram showing a detailed construction of a limiter circuit and monitoring circuit of FIG. 3.

FIG. 8 shows the constructions of the limiter circuit 23 and the monitoring circuit 24. The limiter circuit 23 has a resistance type potential divider circuit comprising resistors R1 and R2 for dividing the voltage of the VPP terminal which is the output terminal of the booster circuit 21. One end of the divider circuit is grounded via an activating NMOS transistor QN1. The NMOS transistor QN1 is controlled by a mode signal MODE which is generated from the control circuit 8.

The connection node N1 of the resistors R1 and R2 is a voltage monitoring node. In order to determine whether the voltage of the monitoring node N1 exceeds a reference voltage Vref, a comparator CMP1 is provided. That is, the resistors R1 and R2 and the reference voltage Vref are set so that the write voltage VPP has a desired value when the voltage of the monitoring node N1 is the reference voltage Vref. The output of the comparator CMP1 enters one input terminal of a NOR gate G1. A mode signal MODE is inverted by an inverter 11 to enter the other input terminal of the NOR gate G1. The output terminal of the NOR gate G1 serves as the output terminal of the voltage determining flag FLG.

The operation of the limiter circuit 23 is as follows. While the mode signal MODE has "L", the limiter circuit 23 is held to be inactive. At this time, the voltage determining flag FLG="L". When the mode signal MODE has "H", the voltage determining flag FLG="H", so that the oscillator 22 is driven to start a booster operation. When the booster output reaches a predetermined level, the voltage of the monitoring node N1 exceeds the reference voltage Vref, so that the output of the comparator CMP1 has "H". As a result, the output of the NOR gate G1 has "L", i.e., the voltage flag FLG="L".

When the voltage determining flag FLG is "L", the oscillator 22 is inactive to stop the booster operation. Then, when the output level of the booster circuit 21 falls so that the voltage of the monitoring node N1 is not higher than the reference voltage Vref, the output of the comparator CMP1 has "L", so that the voltage determining flag FLG is "H" again. Subsequently, while the mode signal MODE is in the operation state of "H", the voltage flag FLG is alternately "H" or "L", so that the high voltage VPP is held so as to have a predetermined level.

The monitoring circuit 24 has a comparator CMP2 for detecting the voltage level of the monitoring node N1 in the limiter circuit 23 to output a monitoring signal indicative of the fact that the high voltage VPP is stabilized. As the power supply terminal and reference input terminal of the comparator CMP2, an external power supply voltage Vextpw and an external reference voltage Vextref are used. The external power supply voltage Vextpw and the external reference voltage Vextref are respectively supplied from the pads PAD2 and PAD3 via a transfer gate which comprises NMOS transistors QN2 and QN3.

In this preferred embodiment, a boot circuit 241 is provided for driving the NMOS transistor QN2. That is, the gate of the NMOS transistor QN2 is controlled by a voltage Vbt which is obtained by boosting an input voltage Vin, which supplied from the pad PAD2, by means of the boot circuit 241. The gate of the NMOS transistor QN2 for transferring the external reference voltage Vextref uses an external power supply voltage which is inputted from the pad PAD2.

In the ground-side terminal of the comparator CMP2, an activating NMOS transistor QN4 controlled by a test signal TEST is provided. The test signal TEST is generated from the control circuit 8 when a test operation is carried out. The output terminal of the comparator CMP2 is connected to the pad PAD1 via a transfer gate TG which comprises a pair of PMOS transistor QP1 and NMOS transistor QN5. The transfer gate TG is also controlled by the test signal TEST.

In the second preferred embodiment, a pad connected to one of a plurality of data input/output terminals (I/O terminals) is used as the pad PAD1, to which the monitoring signal is outputted. In the case of a NAND type EEPROM, pads, such as option terminals, ready/busy (R/B) terminals and write protect (WP) terminals, are used as the pad PAD2 and PAD3, to which the external power supply voltage Vextpw and the external reference voltage Vextref are given. These terminals must be fixed so as to have "L" or "H". However, in the state that the basic operation mode is fixed, if the state of internal terminals connected to these terminals is stored in a latch circuit, these terminals can be utilized as input terminals for other control signals in a test mode. That is, these terminals can be utilized as dummy option terminals even in the case of a package wherein specific option terminals are not equipped.

Figure 9:
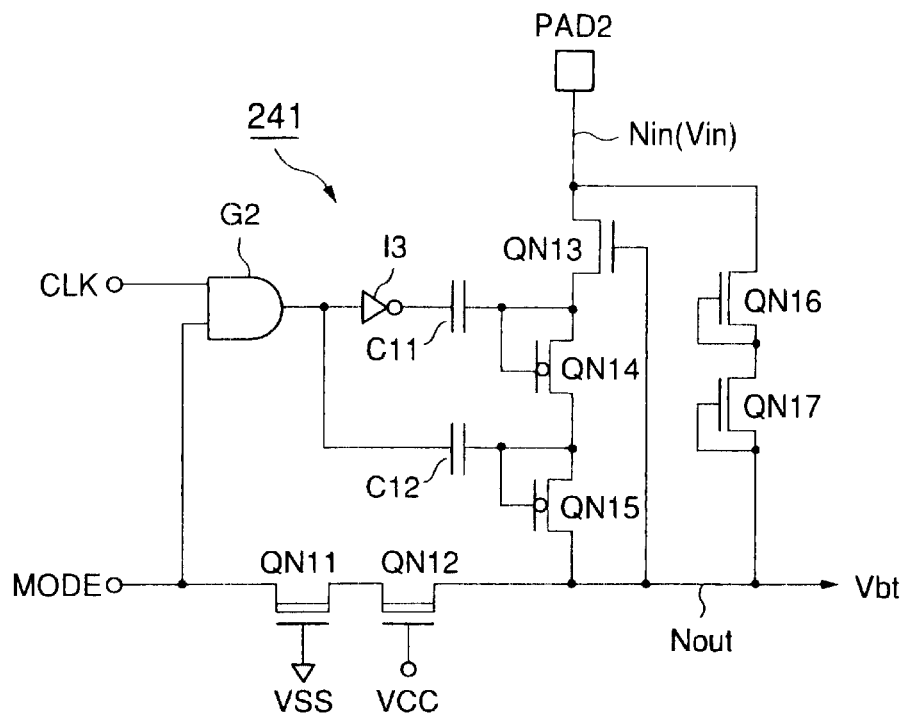
FIG. 9 is a circuit diagram showing a detailed construction of a boot circuit of FIG. 8.

The boot circuit 241 of the monitoring circuit 24 is formed as shown in, e.g., FIG. 9. This boot circuit 241 is well known. In the boot circuit 24, the voltage Vin of an input terminal Nin is controlled by a clock CLK and a mode signal MODE to be transferred to an output terminal Nout for a boot voltage Vbt by NMOS transistors Qn13, QN14 and QN15. That is, when the mode signal MODE has "H", this is transferred to the output terminal Nout via D type NMOS transistors QN11 and QN12. Thus, the NMOS transistor QN13 is turned on.

Simultaneously, an AND gate G2 is activated by the mode signal MODE, and a clock CLK is transferred to capacitors C11 and C12 in a negative phase. The capacitors C12, C12 and the diode-connected NMOS transistors QN14, QN15 constitute a charging pump circuit. By a charging pump operation driven by the clock CLK, the voltage of the input terminal Nin is transferred to the output terminal Nout. Diode-connected NMOS transistors QN16 and QN17 are provided for restricting the voltage level of the output terminal Nout, so that the boot voltage rises to Vbt=Vin+ 2Vth(Vth is a threshold voltage of the NMOS transistors QN16 and QN17).

By controlling the gate of the NMOS transistor QN2 using such a boot circuit 241, the external power supply voltage Vextpw supplied from the pad PAD2 is supplied to the power supply terminal of the comparator CMP2 without falling the level of the external power supply voltage by the NMOS transistor QN2.

In this second preferred embodiment, the operation of a monitor signal output in a test mode will be described below. When the limiter circuit 23 shown in FIG. 8 is activated by the mode signal MODE as described above so that the high voltage VPP reaches a predetermined level, the voltage determining flag FLG becomes "L". Thereafter, while the operation mode signal MODE has "H", the voltage flag FLG is alternately "H" or "L". In accordance therewith, the monitoring node N1 stabilizes the high voltage VPP, and then, signals at a substantially constant level of reference voltage Vref as shown in FIG. 10.

On the other hand, a test signal TEST="H" is given to the monitoring circuit 24 from the control circuit 8, and the external power supply voltage Vextpw and the external reference voltage Vextref are given to the monitoring circuit 24 from the pads PAD2 and PAD3. At this time, a time varied voltage crossing the voltage level of the monitoring node N1 to be shifted is used as the external reference voltage Vextref since the level of the external reference voltage Vextref is lower than the voltage level of the monitoring node N1 as shown in FIG. 10.

Figure 10:
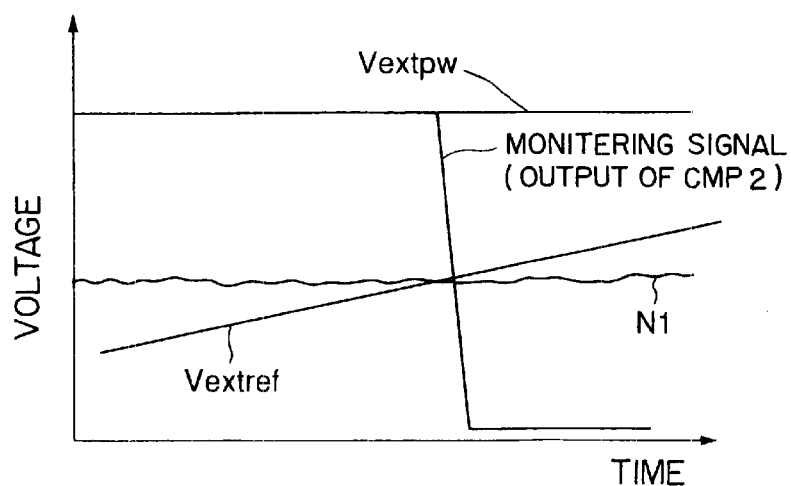
FIG. 10 is a characteristic diagram showing an operation waveform of the monitoring circuit of FIG. 8.

Then, as shown in FIG. 10, the output of the comparator CMP2 has "L" in timing that the external reference voltage Vextref crosses the level of the monitoring node N1. This output of the comparator CMP2 is outputted to the pad PAD1 via the transfer gate TG as a monitoring signal. If the external reference voltage Vextref is such a voltage which is level-shifted with the elapse of time, the outputted monitoring signal has a fixed logical level ("L" in this preferred embodiment) regardless of a slight level oscillation of the monitoring node N1. Therefore, by reading this monitoring signal by an LSI tester, it is possible to simply and surely know that the high voltage VPP is outputted from the booster power supply circuit.

In this test mode, the external reference voltage Vextref in timing in outputting the monitoring signal is substantially equal to the internal reference voltage Vref given to the limiter circuit 23. Therefore, by checking the external reference voltage Vextref, the internal reference voltage Vref can be also confirmed. If the external power supply voltage Vextpw and the external reference voltage Vextref are varied to observe the operation of the comparator CMP2, the circuit operation test of the comparator CMP2 can also be carried out. In particular, it is possible to check the minimum power supply voltage level VCCmin at which the comparator CMP2 normally operates.

(Third Preferred Embodiment)

FIG. 11 shows a limiter circuit 23 and a monitoring circuit 24 in the third preferred embodiment of the present invention. The limiter circuit 23 is the same as that in the above described second preferred embodiment, and the basic construction of the monitoring circuit 24 is also the same as that in the second preferred embodiment. In this third preferred embodiment, in order to control a transfer gate NMOS transistor QN2 to supply an external power supply voltage Vextpw, an appropriate boosted voltage Vm generated therein is used without the need of any boot circuits.

In this case, the boosted voltage Vm is set to be higher than the threshold voltage of the NMOS transistor QN2 with respect to the supplied external power supply voltage Vextpw. Thus, the external power supply voltage Vextpw is given to the comparator CMP2 without falling the level of the external power supply voltage Vextpw. The external reference voltage Vextref is set to be a voltage which is level-shifted with the elapse of time similar to the preceding second preferred embodiment. Thus, with a simpler construction than that in the preceding second preferred embodiment, it is possible to obtain a monitoring signal having no fluctuation in logical level similar to the preceding second preferred embodiment. With respect to the test of the reference voltage Vref of the limiter circuit 23 and so forth, internal circuits can be tested similar to the above-described second preferred embodiment.

(Fourth Preferred Embodiment)

Figure 12:
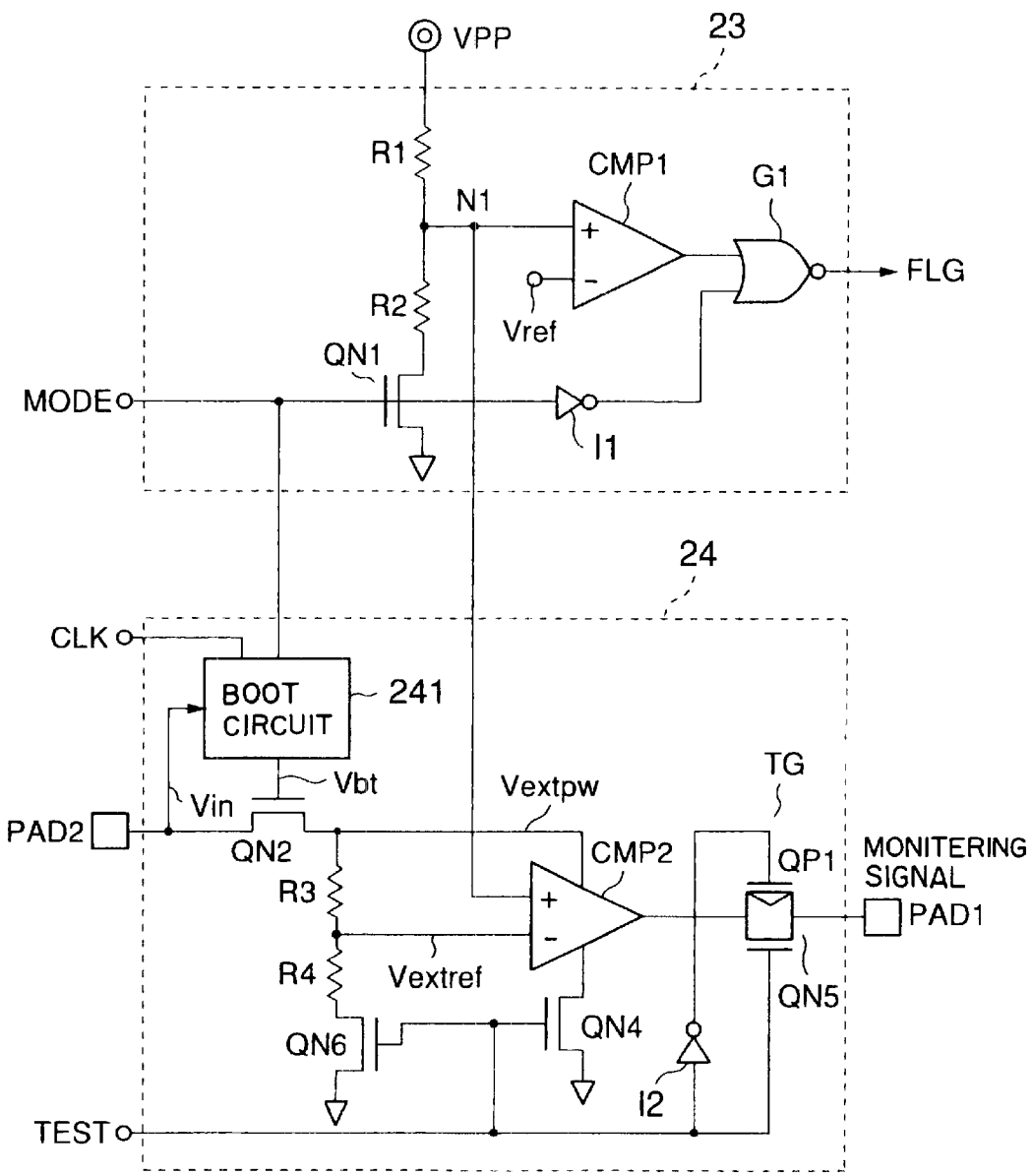
FIG. 12 is a circuit diagram showing a limiter circuit and a monitoring circuit in the fourth preferred embodiment of a semiconductor integrated circuit according to the present invention.

FIG. 12 shows a limiter circuit 23 and a monitoring circuit 24 in the fourth preferred embodiment of a semiconductor integrated circuit according to the present invention. The limiter circuit 23 is the same as that in the preceding second preferred embodiment, and the basic construction of the monitoring circuit 24 is also the same as that in the preceding second preferred embodiment. However, in this fourth preferred embodiment, it is supposed that only one pad PAD2 can be prepared as a testing terminal. Therefore, similar to the semiconductor integrated circuit in the second preferred embodiment, the pad PAD2 supplies the external power supply to the comparator CMP2, and the external reference voltage Vextref is generated by dropping the external power supply voltage Vextpw.

That is, a potential divider comprising resistors R3, R4 and an activating NMOS transistor QN6 connected thereto in series is provided between the source terminal of the transfer gate NMOS transistor QN2 and the ground terminal, so that an external reference voltage Vextref required for the connection node of the resistors R3 and R4 can be obtained. The gate of the activating NMOS transistor QN6 is controlled by a test signal TEST.

Figure 14:
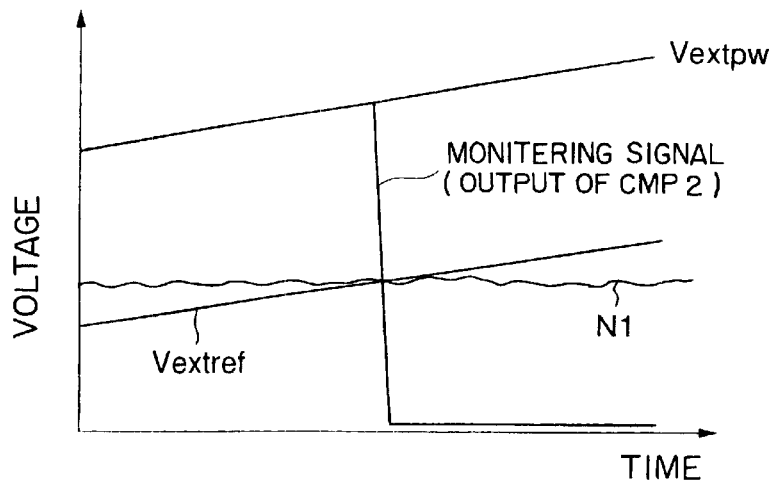
FIG. 14 is a characteristic diagram showing a monitoring operation waveform in the fifth preferred embodiment.

In view of the sensitivity characteristics of an operational amplifier of the comparator CMP2, its power supply voltage and reference voltage have no problem if a constant proportion is maintained. The operation waveform of the monitoring circuit 24 in the fourth preferred embodiment is shown in FIG. 14. The external power supply voltage Vextpw is supplied as a voltage which is level-shifted with the elapse of time. Thus, the external reference voltage Vextref is also a voltage which is level-shifted in accordance with the external power supply voltage Vextpw. Similar to the second preferred embodiment, the values of the resistors R3 and R4 are set so that the reference voltage Vextref crosses the level of the monitoring node N1 after the booster power supply circuit is stabilized.

Thus, similar to the second and third preferred embodiments, it is possible to output a monitoring signal to the pad PAD1. According to the fourth preferred embodiment, the same test can be carried out even if the number of pads capable of being prepared for the test is small. In addition, the activating NMOS transistor QN6 is provided in the resistance type potential divider for generating the external reference voltage Vextref, so that current flows only during the test to suppress useless electric power consumption. Similar to the above described second and third preferred embodiments, it is possible to carry out a test in internal circuits, such as a test in the reference voltage Vref of the limiter circuit 23.

(Fifth Preferred Embodiment)

Figure 13:
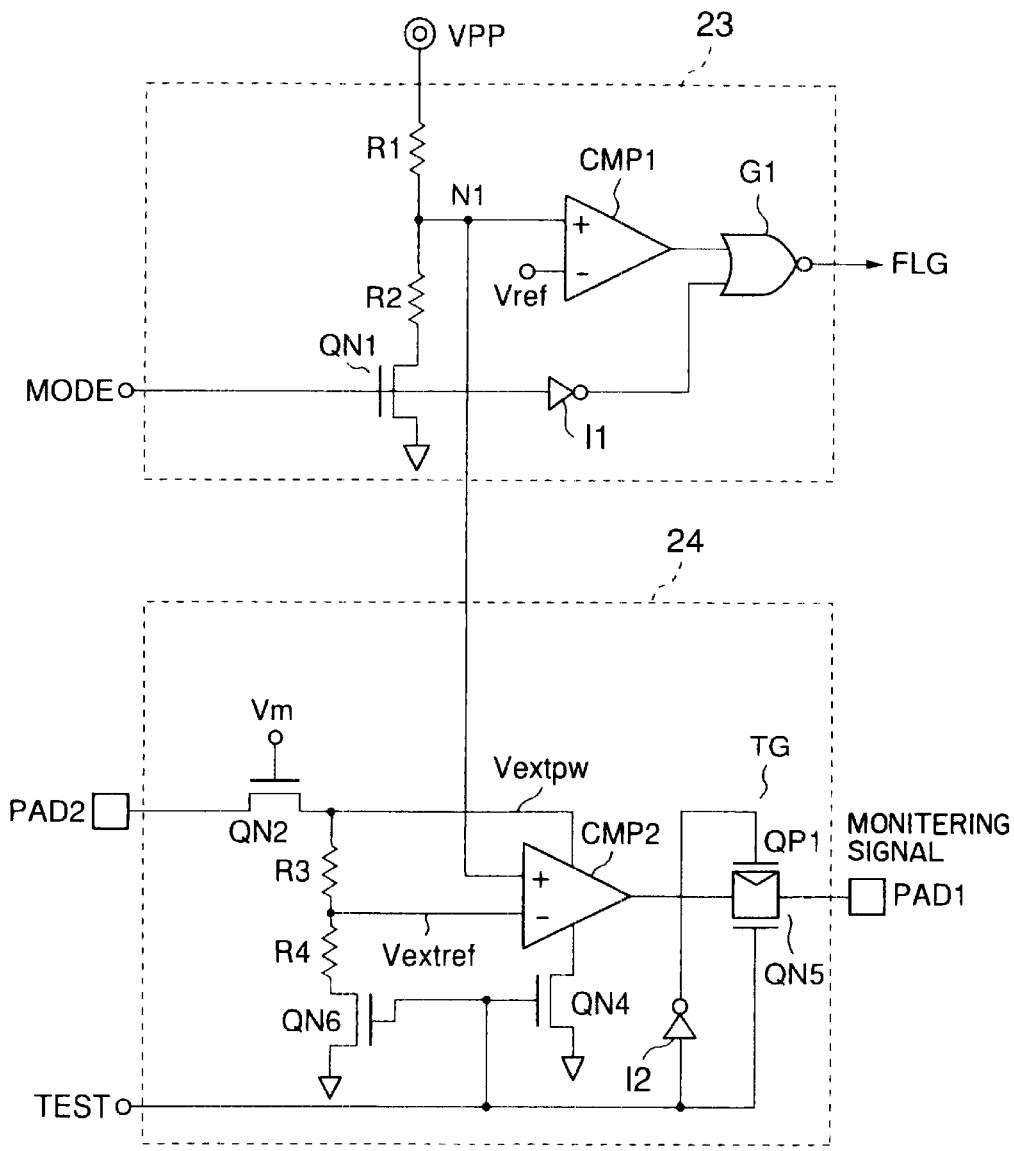
FIG. 13 is a circuit diagram showing a limiter circuit and a monitoring circuit in the fifth preferred embodiment of a semiconductor integrated circuit according to the present invention.

FIG. 13 shows a limiter circuit 23 and a monitoring circuit 24 in the fifth preferred embodiment of the present invention. The difference between the fifth preferred embodiment and the above described fourth preferred embodiment is that the gate of an NMOS transistor QN2 serving as a transfer gate for supplying an external power supply voltage Vextpw from a pad PAD2 uses an appropriate boosted voltage Vm generated therein, without the need of any boot circuits, similar to the third preferred embodiment shown in FIG. 11. Also in this case, the boosted voltage Vm is set to be higher than the threshold voltage of the NMOS transistor QN2 with respect to the supplied external power supply voltage Vextpw.

Similar to the fourth preferred embodiment shown in FIG. 12, the external power supply voltage Vextpw is supplied as a voltage which is level-shifted with the elapse of time, as shown in FIG. 14. Thus, the external reference voltage Vextref is also a voltage which is level-shifted in accordance with the external power supply voltage Vextpw, so that it is possible to output the same monitoring signal as that in the fourth preferred embodiment. Therefore, the same effects as those in the fourth preferred embodiment can not only be obtained, but the circuit also has a simpler construction than that in the fourth embodiment.

(Sixth Preferred Embodiment)

Figure 15:
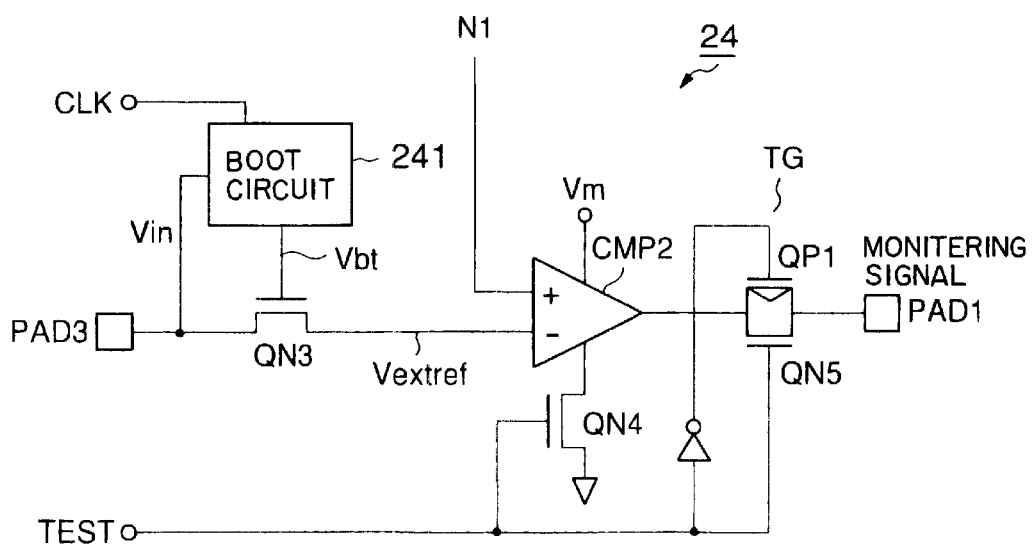
FIG. 15 is a circuit diagram showing a monitoring circuit in the sixth preferred embodiment of a semiconductor integrated circuit according to the present invention.

FIG. 15 shows the construction of a monitoring circuit 24 in the sixth preferred embodiment. The limiter circuit 23 has the same construction as those in the above described second through fifth preferred embodiments, so that the description thereof is omitted. Although the number of pads capable of being prepared for a test is also only one PAD 3 in this sixth preferred embodiment, the one pad PAD3 is used as a supply terminal of the external reference voltage Vextref in the sixth preferred embodiment. The gate of an NMOS transistor QN3 for supplying the external reference voltage Vextref to a comparator CMP2 is controlled by a boosted voltage Vbt which is boosted by means of the same boot circuit 241 as that in the second preferred embodiment. By using the boosted voltage Vbt, it is possible to give the external reference voltage Vextref to the reference terminal of the comparator CMP2 without falling the level of the external reference voltage Vextref.

To the power supply terminal of the comparator CMP2, an appropriate boosted voltage Vm generated therein is given. In this sixth preferred embodiment, the external reference voltage Vextref is given from the pad PAD3 as a voltage which is level-shifted with the elapse of time, as shown in FIG. 10 similar to the second preferred embodiment. The boosted voltage Vm is set to be substantially equal to the external power supply voltage Vextpw in FIG. 14. Thus, the monitor signal can be outputted by the same operation as that in the second preferred embodiment and by a smaller number of pads.

(Seventh Preferred Embodiment)

Figure 16:
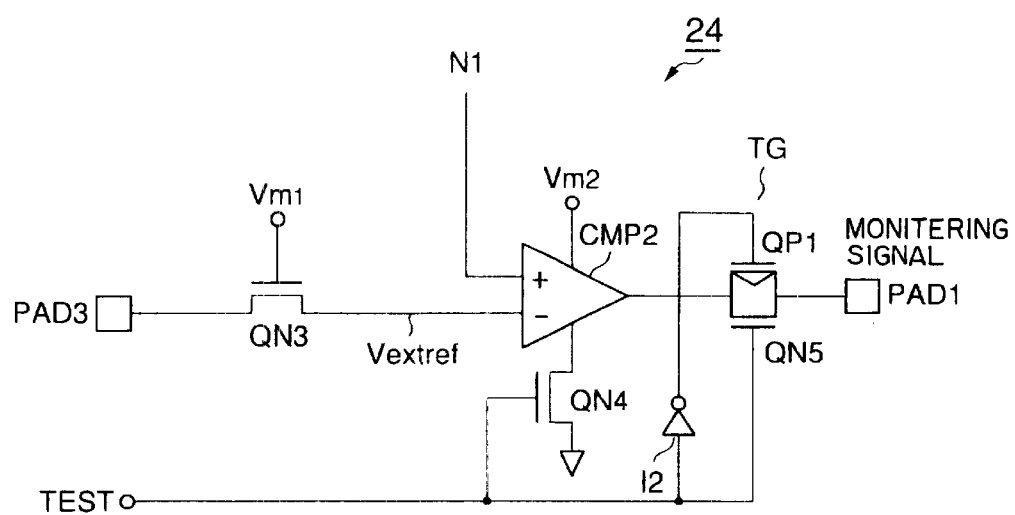
FIG. 16 is a circuit diagram showing a monitoring circuit in the seventh preferred embodiment of a semiconductor integrated circuit according to the present invention.

FIG. 16 shows a monitoring circuit 24 in the seventh preferred embodiment of the present invention as a modification of the sixth preferred embodiment of a semiconductor integrated circuit according to the present invention which is shown in FIG. 15. In this preferred embodiment, an appropriate internal boosted voltage Vm2 is used as a power supply voltage which is to be supplied to a comparator CMP2, and an appropriate boosted voltage Vm1 boosted therein is also applied to the gate of a transfer gate transistor QN3 for giving an external reference voltage Vextref to the comparator CMP2 from a pad PAD3.

The boosted voltage Vm2 is set to be substantially equal to the external power supply voltage Vextpw in FIG. 14. The boosted voltage Vm1 is set to be a value capable of giving the external reference voltage Vextref to the reference terminal of the comparator CMP2 without falling the level of the external reference voltage Vextref. The boosted voltages Vm1 and Vm2 may be the same values, or different values. Also according to the seventh preferred embodiment, the monitor signal can be outputted by the same operation as that in the second preferred embodiment and by a smaller number of pads.

(Eighth Preferred Embodiment)

FIG. 17 shows a limiter circuit 23 and a monitoring circuit 24 in the eight preferred embodiment of the present invention. Although the limiter circuit 23 is the same as those in the preceding preferred embodiments, the construction of the monitoring circuit 24 is greatly different from those in the preceding preferred embodiments. That is, in this eighth preferred embodiment, the monitoring circuit 24 outputs the same monitoring signal as those in the above described first through seventh preferred embodiments, without the need of any voltage supplying pads.

That is, the monitoring circuit 24 in the eighth preferred embodiment is provided with a latch circuit 242 for detecting and holding the switching of a voltage determining flag FLG to "H" level immediately after the operation of the limiter circuit 23 is started, and a latch circuit 243 for detecting and holding the first switching of the voltage determining flag FLG to "L" level after the operation of the limiter circuit 23 is started. The logical product of data held by the latch circuits 242 and 243 is obtained by a gate circuit 244 comprising a NAND gate G16 and an inverter I12 to be supplied to a transfer gate TG.

Figure 18:
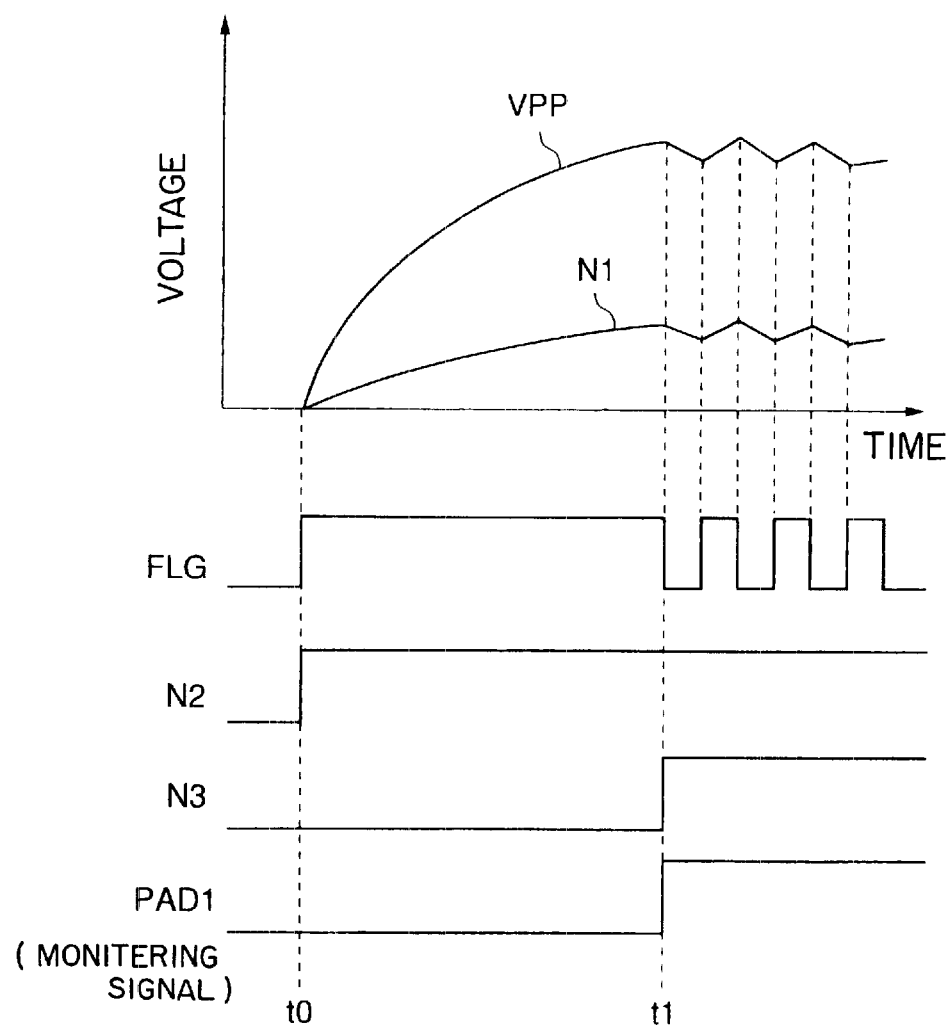
FIG. 18 is a characteristic diagram showing an operation waveform in the eighth preferred embodiment.

Referring to FIG. 18, the operation of this preferred embodiment will be described below. A mode signal MODE rises at time t0 to start the operation of the limiter circuit 23, and the voltage determining flag FLG="H" to start a boosting operation. By this rise of the voltage determining flag FLG, "H" is held in the node N2 of the latch circuit 242. When the boosted voltage VPP reaches a predetermined level, the voltage determining flag FLG is "L" at time t1. Subsequently, the voltage determining flag FLG is alternately "H" or "L". When the voltage determining flag FLG is "L" at time t1, "H" is inputted to the latch circuit 243 by the inverter Il1 and the NOR gate G13, so that "H" is held in the node N3.

The states of the latch circuits 242 and 243 are held until a reset signal RESET is inputted, regardless of the subsequent alternating "H" or "L" of the voltage determining flag FLG. At time t1 at which both of the nodes N2 and N3 have "H", the product thereof is obtained by the gate circuit 244, so that an "H" fixed monitoring signal is generated in the pad PAD1 via a transfer gate TG.

Therefore, according to the eighth preferred embodiment, it is possible to generate a monitoring signal, which can be easily tested by an LSI tester and which is provided for stabilizing the power supply, similar to the preceding preferred embodiments, without the need of any voltage supplying pads.

The present invention should not be limited to the above described preferred embodiments. For example, while the booster power supply circuit of the EEPROM has been described in the first through eighth preferred embodiments, the present invention may be applied to various other semiconductor integrated circuits using internal booster power supply circuits, such as DRAMs. In addition, while the booster power supply circuit has been described as different preferred embodiments, the present invention may be applied to an internal power supply circuit which is selectively activated for generating a step-down power supply voltage therein.

(Ninth Through Nineteenth Preferred Embodiments)

The ninth through nineteenth preferred embodiments of the present invention, which will be described below, relate to a semiconductor integrated circuit having a voltage trimming function. The semiconductor integrated circuit having the voltage trimming function is designed to supply a voltage, which is intended to be set in a voltage monitoring pad serving as an external terminal, from the outside to deactivate a feedback system of a limiter circuit in order to operate the value of resistance of the limiter circuit to read a limiter flag so as to carry out a voltage trimming. Throughout the specification, the term "voltage trimming" means to fine control a voltage, which is shifted from a desired level by the dispersion of circuits, so that the shifted voltage is corrected to be a desired voltage, by varying the value of resistance using a desired voltage supplied from the outside.

(Ninth Preferred Embodiment)

Figure 19:
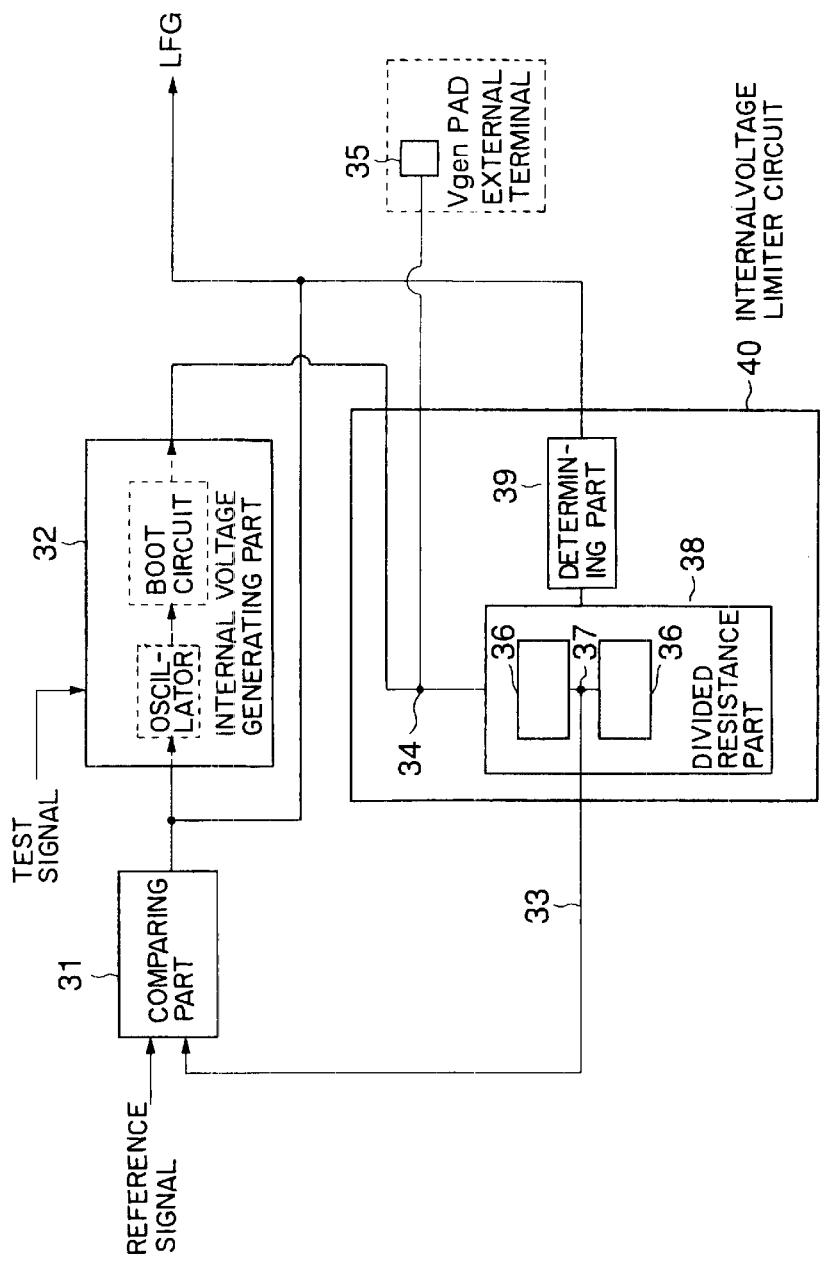
FIG. 19 is a block diagram of the ninth preferred embodiment of a semiconductor integrated circuit according to the present invention, which serves as a basic concept of the ninth through seventeenth preferred embodiments of the present invention.

The ninth preferred embodiment of a semiconductor integrated circuit according to the present invention, which is shown in FIG. 19, is a basic preferred embodiment including an overall concept of the second basic construction of the present invention. In FIG. 19, a semiconductor integrated circuit in the ninth preferred embodiment basically comprises: a comparing part 31 for comparing a predetermined voltage with a reference voltage; an internal voltage generating part 32 for generating an internal voltage on the basis of the output of the comparing part 31; and a divided resistance part 38 for dividing the voltage of an internal voltage node 37 into the predetermined voltage by dividing the internal voltage node 37 with resistance. The semiconductor integrated circuit 30 has a test mode in which, in order to set an internal resistance so as to obtain a desired voltage, a desired trimming voltage is supplied from the outside to an external terminal 35 connected to a first node 34, which is a node between the internal voltage generating part 32 and the divided resistance part 38, to deactivate a feedback part 33 to the internal voltage generating part 32 on the basis of the output of the comparing part 31 to detect the compared result, which is the output of the comparing part 31, to determine the internal resistance.

The semiconductor integrated circuit 30 further comprises an internal voltage limiter circuit 40. The internal voltage limiter circuit 40 comprises: an external terminal 35, connected to the first node which is the node between the feedback part 33 and the internal voltage generating part 32, for a desired trimming voltage from the outside in a test mode in which a test signal is supplied; the resistor dividing part 38 for dividing the trimming voltage with resistance, which is supplied to the first node 34 in the test mode, by series resistor elements 36 to feed the potential of a second node 37, which is the node of the resistor elements 36, back to the comparing part 31 as the predetermined voltage which is to be compared with the reference voltage; and a determining part 39 for deactivating the internal voltage generating part 32 to stop the feedback when the desired trimming voltage is supplied to the first node 34 from the external element 35 in the test mode, and for determining resistance bit data, which are used for setting the internal resistance, by detecting the compared result of the comparing part.

In FIG. 19, elements and voltage signal supply lines shown by solid lines show the construction of any one of the tenth, eleventh, thirteenth, fourteenth, sixteenth and seventeenth preferred embodiments of a semiconductor integrated circuit according to the present invention, and elements shown by dotted lines show the construction of any one of the twelfth, fifteenth and eighteenth preferred embodiments of a semiconductor integrated circuit according to the present invention. The details of the respective preferred embodiments will be described below.

(Tenth Preferred Embodiment)

Referring to FIGS. 20 through 25, the tenth preferred embodiment of a semiconductor integrated circuit according to the present invention will be described below. The tenth preferred embodiment is a most basic example of the second basic construction of the present invention, and is a preferred embodiment including a circuit wherein the relationship between a reference voltage Vref and an internal voltage Vgen is "Vref<Vgen".

A voltage trimming circuit 41 comprises three elements consisting of: a reference voltage generating circuit 42 for generating a reference voltage Vref; an internal voltage Vgen limiter circuit 40 for generating an internal voltage Vgen using the reference voltage Vref as a comparative reference voltage; and a "Vgen PAD" serving as an external terminal 35 of a limiter circuit 40. A typical circuit serving as the reference voltage generating circuit 42 is a BGR (Band Gap Reference) circuit shown in FIG. 21. In this BGR circuit, a discharging path comprising a resistor R1 and a diode D1 is connected in parallel to a discharging path comprising resistors R2, R3 and N diodes D2 connected, and a feedback circuit is provided for allowing the potentials of a node Va and a node Vb to be equal to each other. Therefore, the following formula (4) can be derived from the following formulae (1), (2) and (3).

$$I1 \cdot R1 = I2 \cdot R2 \tag{1}$$

$$Va = kT/q \cdot \ln(I1/Is) \tag{2}$$

$$Vb = I2 \cdot R3 + kT/q \cdot \ln\{I2/(N \cdot Is)\} \tag{3}$$

$$Vref = Va + R2/R3 \cdot kT/q \cdot \ln(N \cdot R2/R1) \tag{4}$$

By setting the respective values so as to compensate the temperature characteristics of the first and second items of the formula (4), an accurate reference voltage Vref having no temperature dependency can be generated.

Figure 21:
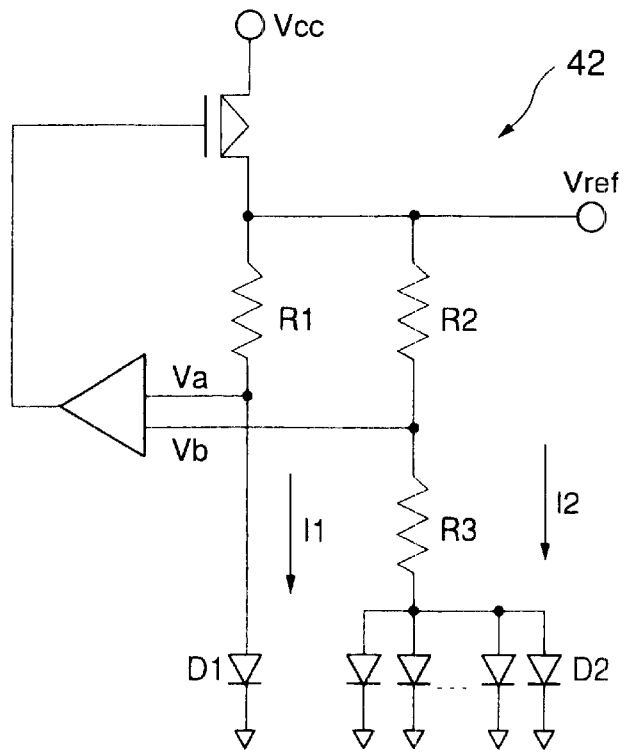
FIG. 21 is a circuit diagram showing an example of a detailed construction of a reference voltage generating circuit 42 of FIG. 20.
Figure 22:
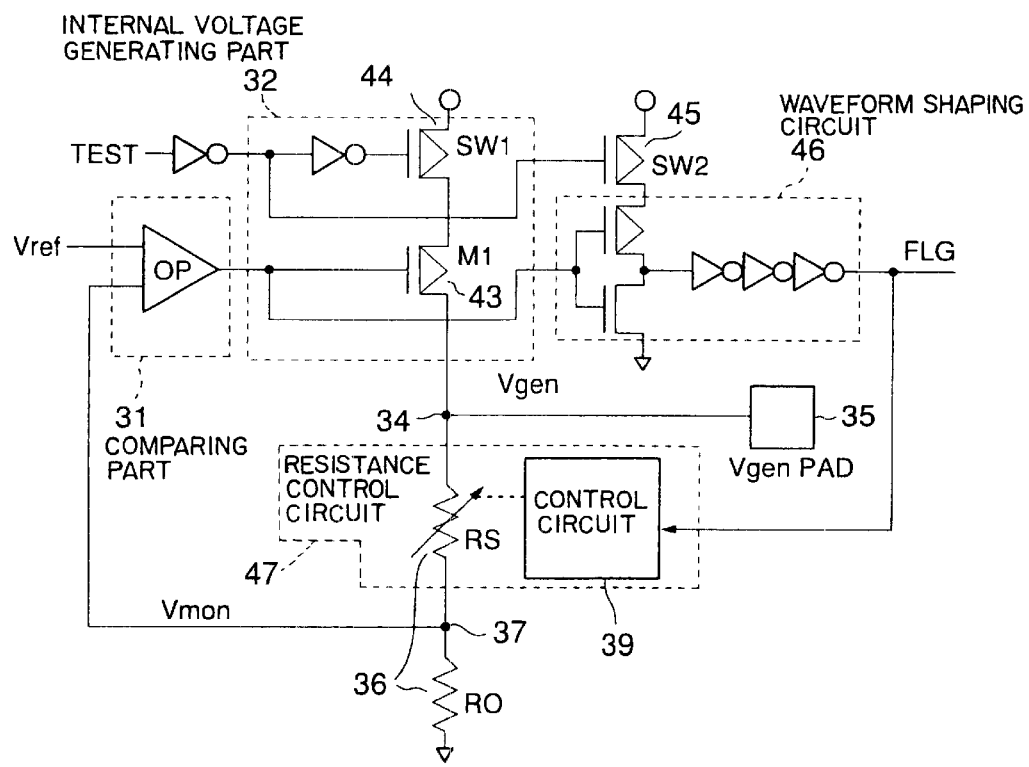
FIG. 22 is a block diagram of the tenth preferred embodiment of a semiconductor integrated circuit according to the present invention.

As shown in FIG. 22, the limiter circuit comprises: a comparing part 31 comprising a comparator (OP amplifier) for comparing a reference voltage Vref, which is supplied from a BGR circuit 42 (FIG. 21), with a voltage Vmon of a node 37, the internal resistance of which is potential-divided; an internal voltage generating part 32 comprising a PMOS 43, to the gate of which the output of the comparator is inputted, and a first switch 44 which is turned off by a control signal TEST during a voltage trimming test; a second switch 45 which is turned on by the control signal; a waveform shaping circuit 46 for waveform-shaping the compared output of the comparing part 31 to output it as a flag; and a resistance control circuit 47 for varying so as to simply increase or decrease the value of internal variable resistance, which constitutes series resistors 36, on the basis of the control signal including the flag. In the tenth preferred embodiment, the resistance control circuit 47 includes a variable resistor and a control circuit 39, and the node 37 is the node between an RS resistor and an RO resistor. To the node 34 which is the node of the PMOS (M1) 43 and the variable resistor, a trimming voltage is supplied from a pad "Vgen PAD" serving as a voltage trimming external terminal 35.

With this construction, the operation of the tenth preferred embodiment of a semiconductor integrated circuit with voltage trimming function according to the present invention will be described below. First, the reference voltage generating circuit 42 shown in FIG. 21 generates an internal reference voltage Vref of the whole chip. A typical circuit serving as the reference voltage generating circuit 42 is the above described BGR circuit. The reference voltage Vref is used as a comparative reference voltage in the limiter circuit 40 of the internal voltage Vgen. In a usual operation, the voltage Vmon of the second node 37, which is resistorly potential-divided, is compared with the reference voltage Vref in the comparing part 31 comprising an OP amplifier to feed back to generate an internal voltage Vgen which is expressed by the following formula.

$$Vgen=Vref \cdot (1+RS/RO)$$

During a voltage trimming test, a control signal TEST is High, the PMOS (SW1) of a current path of the limiter serving as the first switch 44 is turned off, and the PMOS (SW2) serving as the second switch 45 to an output circuit for a flag signal is turned on. In this test mode, simultaneously with the above described operation, a trimming voltage intended to be set is applied to the "Vgen PAD" serving as the external terminal 35. When the value of resistance of the resistor RS serving as a variable resistor constituting the series resistors 36 is varied, the logic of the flag signal FLG is switched. The process of variation at this time is shown in the waveform of the resistance control circuit of FIG. 25. The varying direction is a monotonously increasing direction or a monotonously decreasing direction. When the logic of the flag signal FLG is switched, the value of resistance is stored.

FIGS. 23B and 23C show the detailed construction of the variable resistor RS shown in FIG. 23A. The variable resistor RS may comprise a plurality of resistors R1, R2, R3, ..., Ri which are connected in parallel, and a plurality of transistors which are source/drain connected in series to the respective resistors, as shown in FIG. 23B, or a plurality of resistors R1, R2, R3, ..., Ri which are connected in series, and a plurality of transistors which are connected in parallel to the respective nodes of the respective resistors, as shown in FIG. 23C.

The variable resistor shown in FIG. 23A comprises a combination of resistors and transistors as shown in FIG. 23B or 23C, and digitally varies the value of resistance by a control signal of resistance bit data of i bits from the resistor R1 to the resistor Ri. Therefore, it can be stored as digital data if the setting of R1 through Ri is stored when the flag signal is varied.

Referring to FIG. 24, a trimming test carried out by supplying a trimming voltage from the external terminal 35 will be described below. In FIG. 24, the control circuit 39 of FIG. 22 comprises: a counter 48, controlled by a reset signal RST, a clock signal CLK and a test signal TEST to be counted up by the clock signal, for outputting resistance bit data R1 through Ri; a determining part 49 for determining the resistance bit data R1 through Ri, which are outputted from the counter 48, by the flag signal FLG outputted from the waveform shaping circuit 46; and a register 50 serving as internal storing means for storing the resistance bit data determined by the determining part 49.

Figure 25:
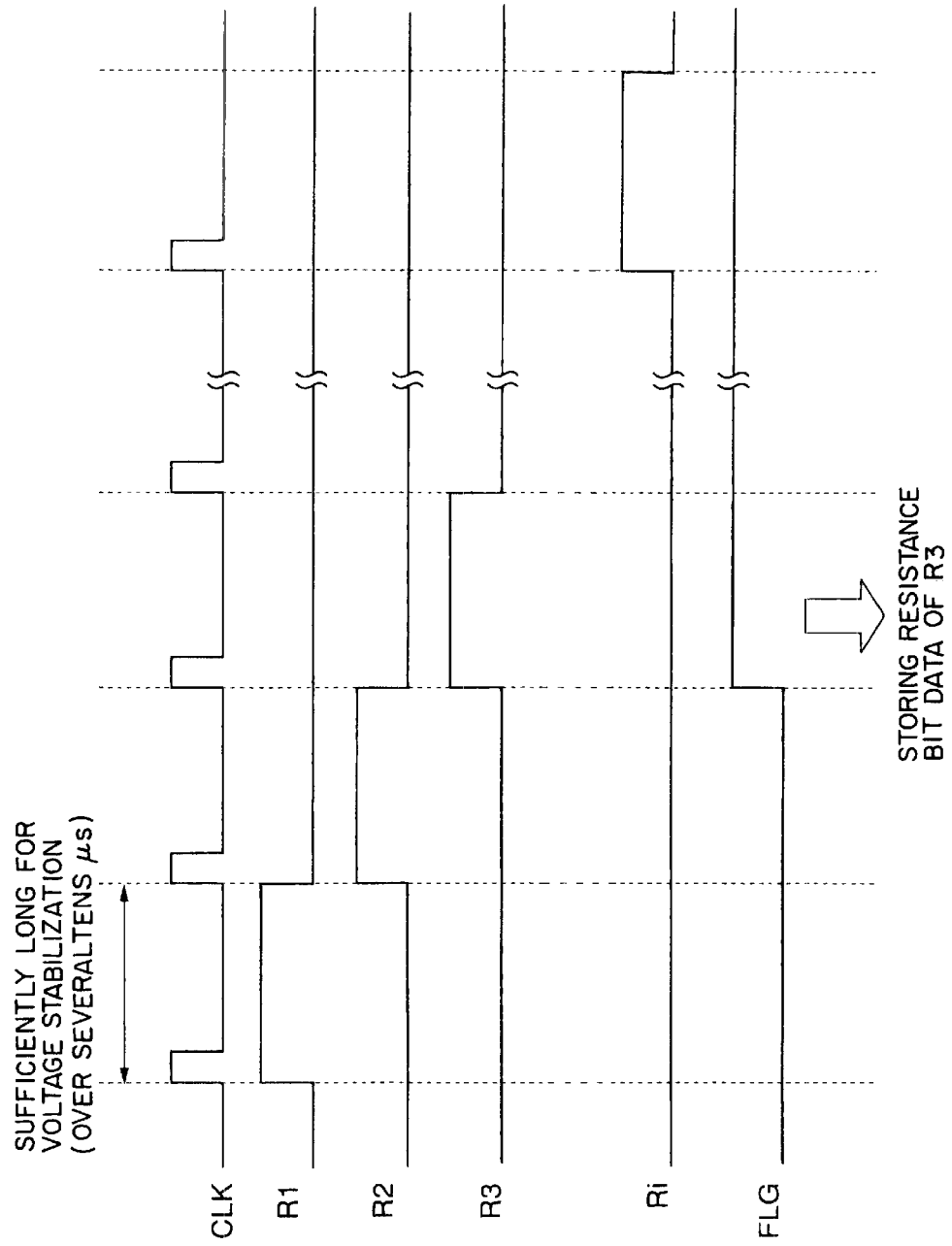
FIG. 25 is a characteristic diagram showing an operation waveform of the resistance control circuit of FIG. 24.

In FIG. 25, the waveform of a clock signal CLK having a sufficiently long clock period for the stabilization of voltage is shown in the top stage, data of the values of resistance R1 through Ri are shown in the middle stage, and the waveform of the flag signal FLG is shown in the bottom stage. As shown in FIG. 25, the resistance bit data of the value of resistance R3 when the flag signal FLG rises are stored in the register 50 shown in FIG. 24.

The relationship between the resistance bit data R1 through Ri outputted from the counter 48 and data determined by the determining part 49 on the basis of the flag signal FLG is shown in FIG. 25. The resistance bit data are counted up by the sufficiently long clock signal of tens μs or more for the stabilization of voltage, to be sequentially outputted. The determining part 49 detects that the logic of the flag signal FLG is switched, so that the outputted resistance bit data are outputted to the register 50 to be stored therein.

If the variable resistance is set in the stored resistance bit data after the trimming test, a voltage approximating a voltage given to the Vgen node from the outside is also outputted during a usual operation. Since the levels of circuit elements other than the PMOS (M1) are detected by the same circuit, this trimming test can trim all of dispersions of the reference voltage circuit system and limiter circuit system, so that a predetermined voltage can be set even if the variation in voltage of the reference voltage circuit system and limiter circuit system is caused by the trimming function of the semiconductor integrated circuit according to the present invention.

Since the time that the logic of the flag signal FLG is switched can be detected to store the resistance bit data of the variable resistor can be stored by the operation in the chip, the trimming test operation can be simultaneously carried out with respect to a plurality of chips, so that the time required to carry out the test can be shortened.

(Eleventh Preferred Embodiment)

Since the resistorly potential-divided node Vmon for Vgen is compared with Vref according to the present invention, Vgen>Vmon must be always established as the tenth preferred embodiment. For that reason, if the voltage values of Vref and Vgen are equal to each other, or if Vgen<Vref, a second reference voltage Vref2 must be generated so that Vref2<Vgen. Therefore, in the case of Vgen<Vref, a level shifter circuit for level-shifting Vref to Vref2 (Vref2<Vgen<Vref) is provided as the eleventh preferred embodiment which will be described below.

Referring to FIGS. 26 and 27, the eleventh preferred embodiment of an integrated circuit system according to the present invention will be described below. FIG. 26 is a block diagram showing the circuit construction of the eleventh preferred embodiment of an integrated circuit according to the present invention, and FIG. 27 is a circuit block diagram showing the detailed construction of a limiter circuit for an internal voltage Vgen. As shown in FIG. 26, the differences between the eleventh preferred embodiment and the tenth preferred embodiment are that a level shifter circuit 51 is provided for generating a second reference voltage Vref2 from a first reference signal Vref and that a compared voltage supplied from an internal voltage Vgen limiter circuit 40 is changed from the first reference voltage Vref to the second reference voltage Vref2. Other constructions are the same as those in the tenth preferred embodiment of a semiconductor integrated circuit according to the present invention.

As described above, the eleventh preferred embodiment is a preferred embodiment in a case where the internal voltage Vgen is lower than the reference voltage Vref. In such a case, as shown in FIG. 26, a voltage trimming circuit comprises three elements consisting of a reference voltage generating circuit 42 for generating a first reference voltage Vref, the level shifter circuit 51 for generating a second reference voltage Vref2 on the basis of the first reference voltage Vref, and an internal voltage Vgen limiter circuit 40 for generating an internal voltage Vgen using the second reference voltage Vref2 as a compared reference voltage. A "Vgen PAD" serving as an external terminal 35 is provided with the limiter circuit 40.

Figure 20:
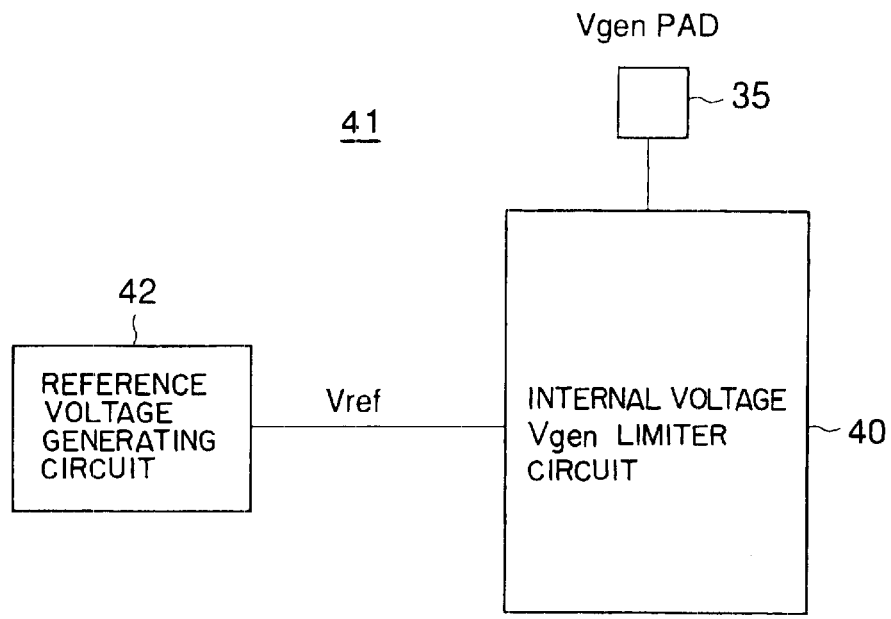
FIG. 20 is a block diagram showing a basic construction of the tenth preferred embodiment of a semiconductor integrated circuit according to the present invention.

The reference voltage generating circuit 42 may comprise a BGR circuit having the same construction as that in the tenth preferred embodiment of a semiconductor integrated circuit according to the present invention which has been described referring to FIG. 20. In FIG. 26, the level shifter circuit 51 comprises a comparator 52 for comparing the first reference voltage Vref with the internal voltage, a PMOS 53 and a resistor element 54 connected in series between a ground node and a power supply node. In the level shifter circuit 51, the voltage of the node between the PMOS 53 and the resistor element 54 serves as a comparing input of the comparator 52. The resistor element 54 is divided into two parts by a node 56 to generate a second reference voltage Vref2. The second reference voltage Vref2 is supplied to the limiter circuit 40.

The construction of the limiter circuit 40 is shown in FIG. 27. Since this is the same as that of the limiter circuit 40 in the tenth preferred embodiment shown in FIG. 22 except that the inputted reference voltage is the second reference voltage Vref2 generated as shown in FIG. 26, the same reference numbers are given to the same elements, and the duplicate description thereof is omitted.

With respect to the operation of the eleventh preferred embodiment of a semiconductor integrated circuit with voltage trimming function according to the present invention, the operation of the limiter circuit 40 is particularly the same as that in the tenth preferred embodiment of a semiconductor integrated circuit according to the present invention, so that the duplicate description thereof is omitted. However, the reference voltage inputted to the OP amplifier constituting the comparator 31 is the second reference voltage Vref2 which is stepped down. The reason why the second reference voltage Vref2 is stepped down is as follows. Since the resistorly potential-divided node for Vgen is compared with the reference voltage according to the present invention as described above, the internal voltage Vgen must always meet the relationship "Vgen>Vmon". For that reason, in a case where the voltage values of Vref and Vgen are equal to each other, or in the case of the eleventh preferred embodiment wherein "Vgen<Vref", the second reference voltage Vref2 must be generated so that "Vref2<Vgen". For that reason, the level shifter circuit 51 described referring to FIG. 26 is provided for level-shifting the reference voltage Vref to the second reference voltage Vref2 (Vref2<Vgen<Vref) in the case of "Vgen<Vref".

The second reference voltage Vref2 stepped down is used as a compared reference voltage in the limiter circuit 40 for the internal voltage Vgen. In a usual operation, the voltage Vmon of the resistorly potential-divided node 37 is compared with the second reference voltage Vref2 by the OP amplifier of the comparator 31, and an internal voltage Vgen is expressed by the following formula.

$$Vgen=Vref2\cdot(1+RS/RO)$$

During a voltage trimming test, a test signal TEST is High, the PMOS (SW1) of a current path of the limiter serving as the first switch 44 is turned off, and the PMOS (SW2) serving as the second switch 45 to an output circuit for a flag signal is turned on. In this test mode, simultaneously with the above described operation, a trimming voltage intended to be set is applied to the "Vgen PAD" serving as the external terminal 35. When the value of resistance of the resistor RS serving as the variable resistor 36 is varied, the logic of the flag signal FLG is switched. The process of variation at this time is shown in FIG. 25 representing the waveform of the resistance control circuit. The varying direction of the value of resistance is a monotonously increasing direction or a monotonously decreasing direction. When the logic of the flag signal FLG is switched, the value of resistance is stored.

(Twelfth Preferred Embodiment)

The above described tenth and eleventh preferred embodiments have been described assuming that the power supply voltage VCC is higher than the internal voltage Vgen (Vgen<VCC) although the relationship between the values of the power supply voltage VCC and the internal voltage Vgen has not been described. However, there are some cases where the internal voltage is higher than the power supply voltage. In this case, the internal voltage can not be generated unless it is stepped up. For that reason, in the twelfth preferred embodiment of a semiconductor integrated circuit according to the present invention, the construction of a circuit in the case of "VCC<Vgen" is shown in FIG. 28.

Figure 28:
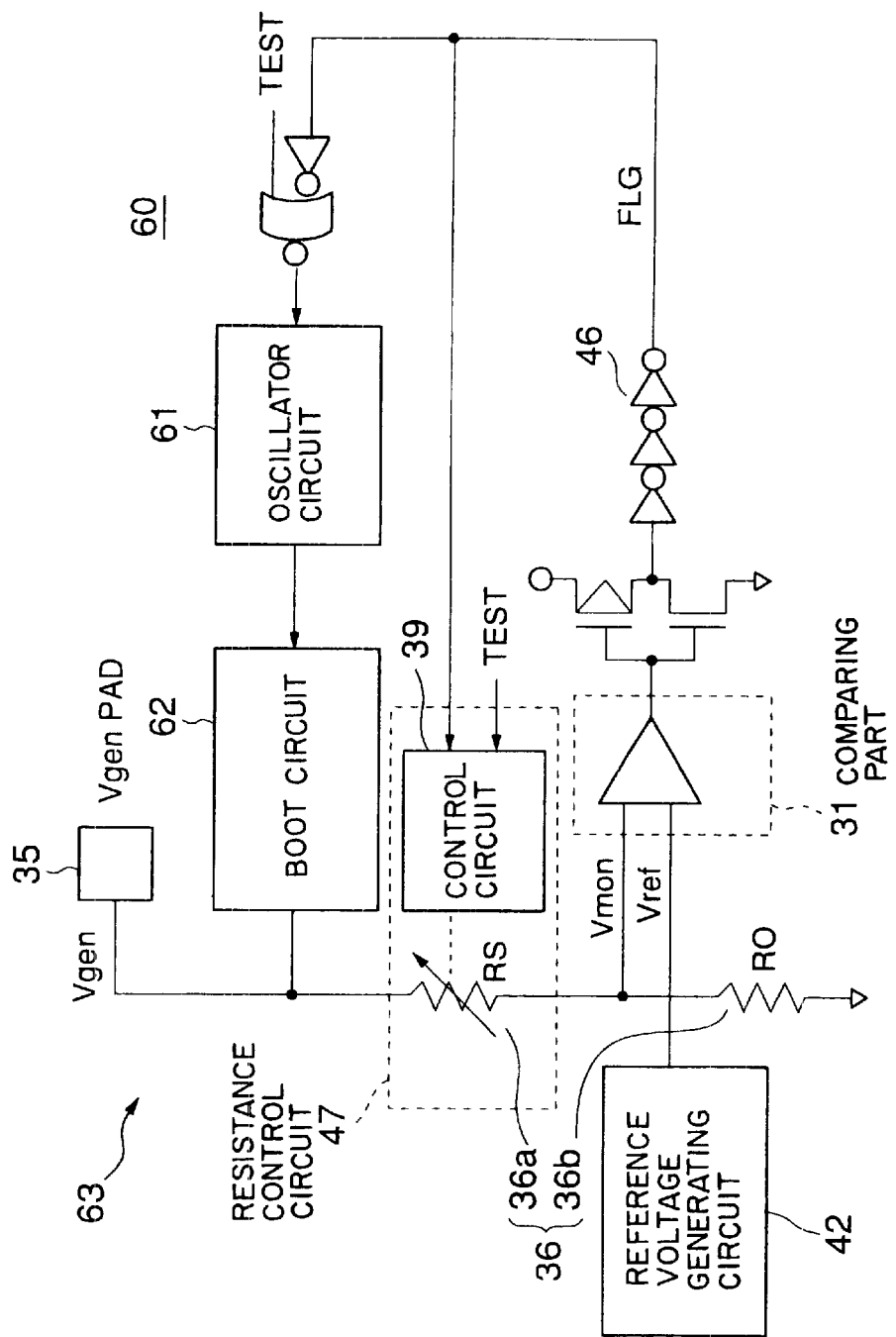
FIG. 28 is a circuit block diagram of the twelfth preferred embodiment of a semiconductor integrated circuit according to the present invention.

In FIG. 28, the whole construction of the twelfth preferred embodiment of a semiconductor integrated circuit 60 according to the present invention is different from those in the tenth and eleventh preferred embodiments since the internal voltage Vgen is higher than the power supply voltage VCC. The semiconductor integrated circuit 60 comprises an oscillator circuit 61 for generating a pulse for boosting an internal voltage Vgen, a booster circuit 62 for generating the internal voltage Vgen, and a limiter circuit 63. A reference voltage generated by a reference voltage generating circuit 42 shown in FIG. 21 is supplied to the limiter circuit 63. For example, the oscillator 61 is a typical oscillator wherein inverters in odd number stages are cascade-connected and a NAND circuit is connected to the final stage.

The booster circuit 62 is a charging pump circuit having the same construction of the booster circuit 21 in the second preferred embodiment which has been described referring to FIGS. 4 and 5. That is, the two-phase driven charging pump circuit shown in FIG. 4 or the quadri-phase driven charging pump circuit shown in FIG. 5 may be applied to the circuit in the twelfth preferred embodiment.

In a usual operation, a starting signal for generating an internal voltage Vgen rises, the oscillator circuit 61 outputs a pumping pulse, and the booster circuit 62 boosts the internal voltage Vgen. The boosted voltage is monitored by the limiter circuit 63, and the flag signal FLG which is the output of the limiter circuit 63 is fed back, so that the internal voltage Vgen is controlled so as to be a voltage determined by "Vref·(1+RS/RO)".

On the other hand, during a voltage trimming test, the test signal TEST is set to be High to stop the pumping pulse, and a predetermined trimming voltage Vgen is supplied to the "Vgen PAD" serving as the external terminal 35. In this state, similar to the tenth preferred embodiment, the variable resistance is varied in a monotonous direction by resistance bit data, so that the logic of the flag signal FLG is inverted by a certain value of resistance shown in FIG. 25. This resistance bit data during inversion are stored and set in a usual operation, so that it is possible to carry out a voltage trimming including the dispersion in the reference voltage circuit system 42 and limiter circuit system 63.

Similar to the tenth and eleventh preferred embodiments, since the resistance bit data at the inversion of the logic of the flag signal FLG are detected in the internal circuit, a plurality of chips can be measured, and the testing time can be shortened.

(Thirteenth Through Fifteenth Preferred Embodiments)

Figure 29A:
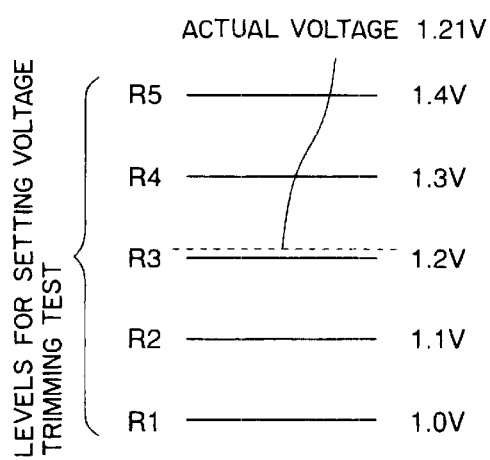
FIGS. 29A and 29B are characteristic diagrams for explaining the principle that the precision of error in the thirteenth through fifteenth preferred embodiments of a semiconductor integrated circuit according to the present invention.
Figure 29B:
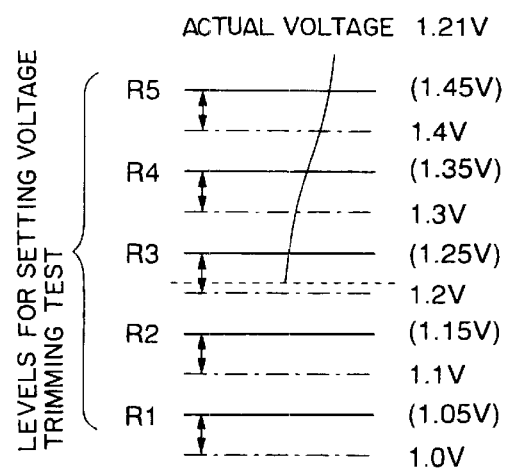

The thirteenth through fifteenth preferred embodiments of the present invention are preferred embodiments for preventing the increase of errors from the relationship between set values and errors in a voltage trimming shown in FIGS. 29A and 29B. The thirteenth through fifteenth preferred embodiments correspond to the tenth through twelfth preferred embodiments, respectively, except that a third switch is provided for improving error precision.

First, the relationship between set values and errors in a voltage trimming will be described.

As shown in FIGS. 29A and 29B, it is considered that a voltage trimming is carried out at voltage trimming set levels R1 through R5. For example, assuming that an actual voltage exists at a position of 1.21 V as shown in FIGS. 29A and 29B, the logic of the flag varies at R4=1.3 V by the voltage trimming test in the case of FIG. 29A. Therefore, the voltage after trimming is set to be R4=1.3 V, so that the difference between the actual voltage and the set voltage is 0.09 V to make the same error as the step width of the trimming. It is thus considered that the error range in FIG. 29A is a range of from 0 V to less than 0.1 V. However, if the levels during voltage trimming tests and usual set levels are shifted by a half step level as shown in FIG. 29B to raise the level by the half step during the voltage trimming tests, the actual voltage 1.21 V is determined to be R3 since the logic of the flag signal varies at R=1.25 V, and the set level is R3=1.2 V since it falls by the half step during a usual operation. Therefore, the error is 0.01 V, and the error range is ±0.5 V in the case of FIG. 29B. Thus, although the step in trimming is 0.1 V which is the same in FIGS. 29A and 29B, the error in FIG. 29A is 1 V at the maximum, and the error in FIG. 29B is 0.5 V at the maximum, so that it is possible to decrease errors in FIG. 29B.

(Thirteenth Preferred Embodiment)

In the thirteenth preferred embodiment shown in FIG. 30, a resistor RT and third switch SW3 for shifting a voltage/resistance set level by a half step are provided in the tenth preferred embodiment shown in FIG. 22. By this third switch SW3, the voltage set levels during a voltage trimming test and a usual operation can be shifted from each other by a half step, and errors can be decreased as shown in FIG. 29B.

(Fourteenth Preferred Embodiment)

Figure 31:
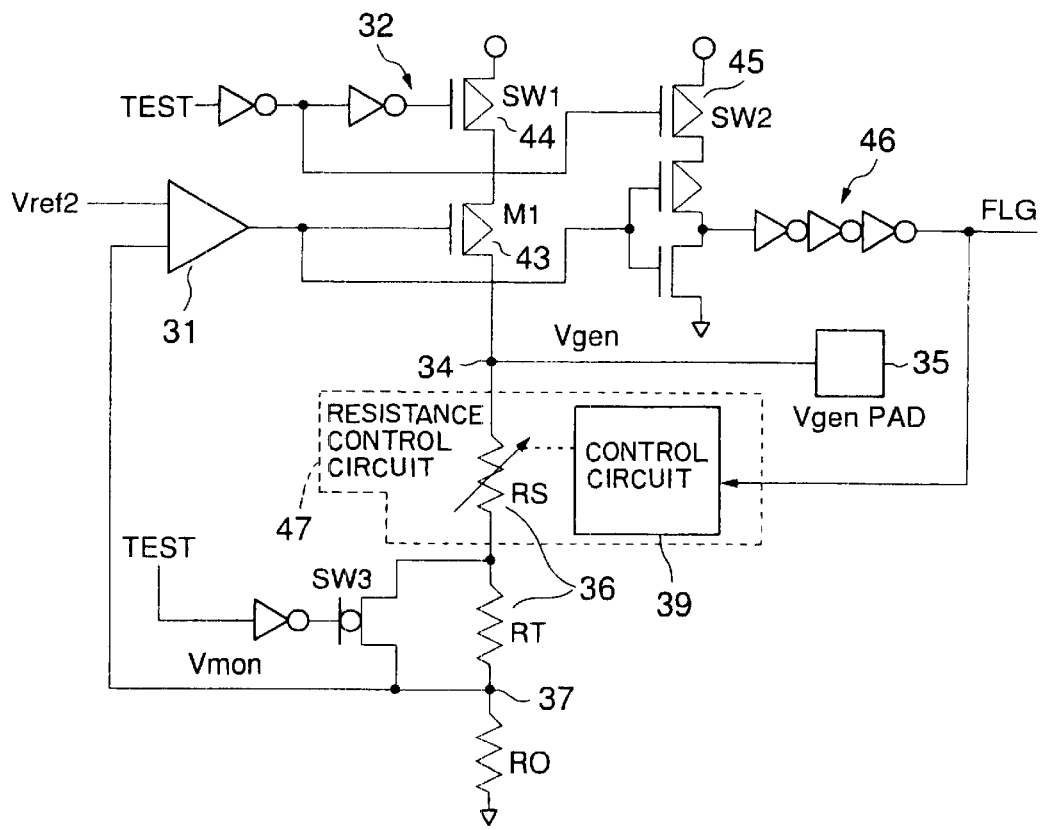
FIG. 31 is a circuit block diagram of the fourteenth preferred embodiment of a semiconductor integrated circuit according to the present invention.

Also in the fourteenth preferred embodiment shown in FIG. 31, a resistor RT and third switch SW3 for shifting a voltage/resistance set level by a half step are provided in the eleventh preferred embodiment shown in FIG. 27. By this third switch SW3, the voltage set levels during a voltage trimming test and a usual operation can be shifted from each other by a half step, and errors can be decreased as shown in FIG. 29B.

(Fifteenth Preferred Embodiment)

Figure 32:
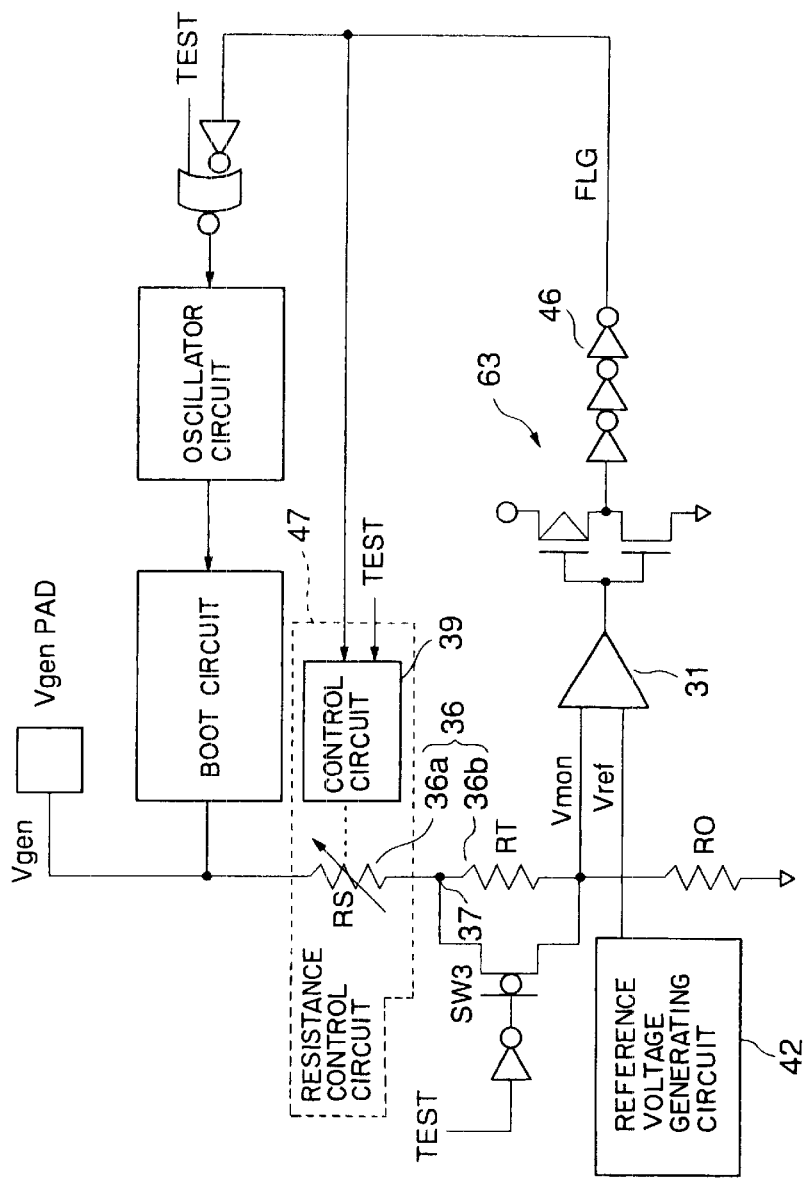
FIG. 32 is a circuit block diagram of the fifteenth preferred embodiment of a semiconductor integrated circuit according to the present invention.

Also in the fifteenth preferred embodiment shown in FIG. 32, a resistor RT and third switch SW3 for shifting a voltage/resistance set level by a half step are provided in the twelfth preferred embodiment shown in FIG. 28. By this third switch SW3, the voltage set levels during a voltage trimming test and a usual operation can be shifted from each other by a half step to decrease errors as shown in FIG. 29B.

(Sixteenth And Seventeenth Preferred Embodiments)

Figure 33:
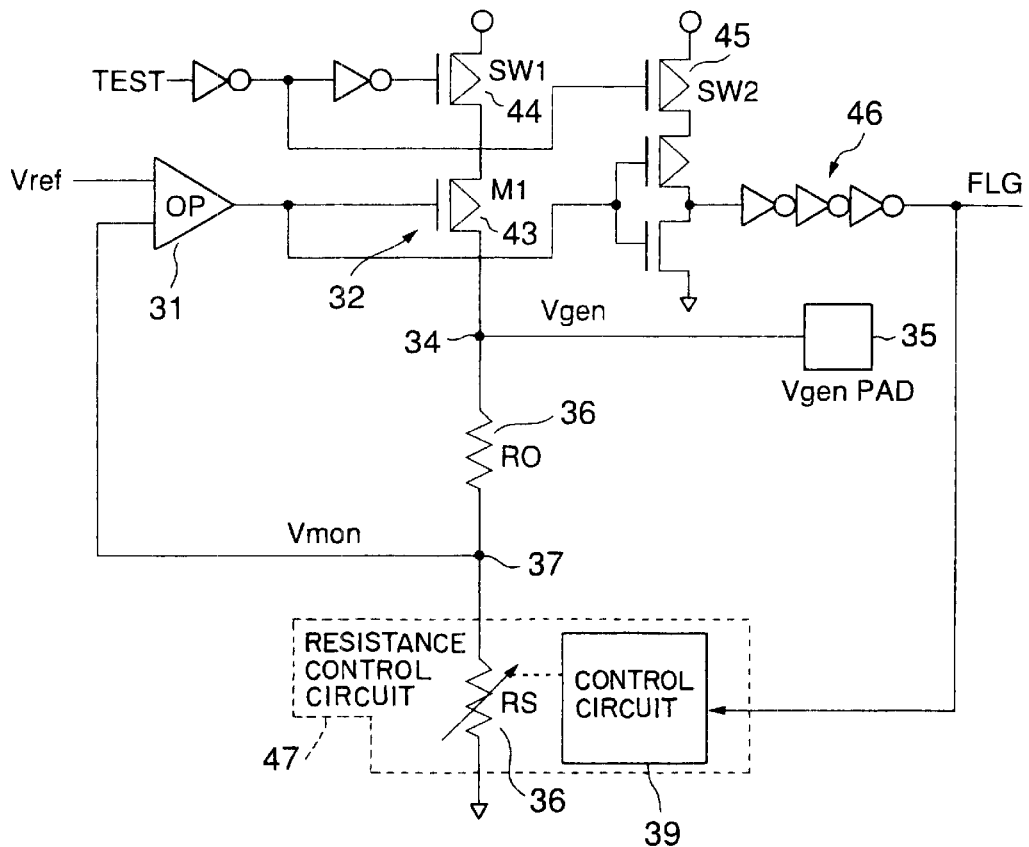
FIG. 33 is a circuit block diagram of the sixteenth preferred embodiment of a semiconductor integrated circuit according to the present invention.
Figure 34:
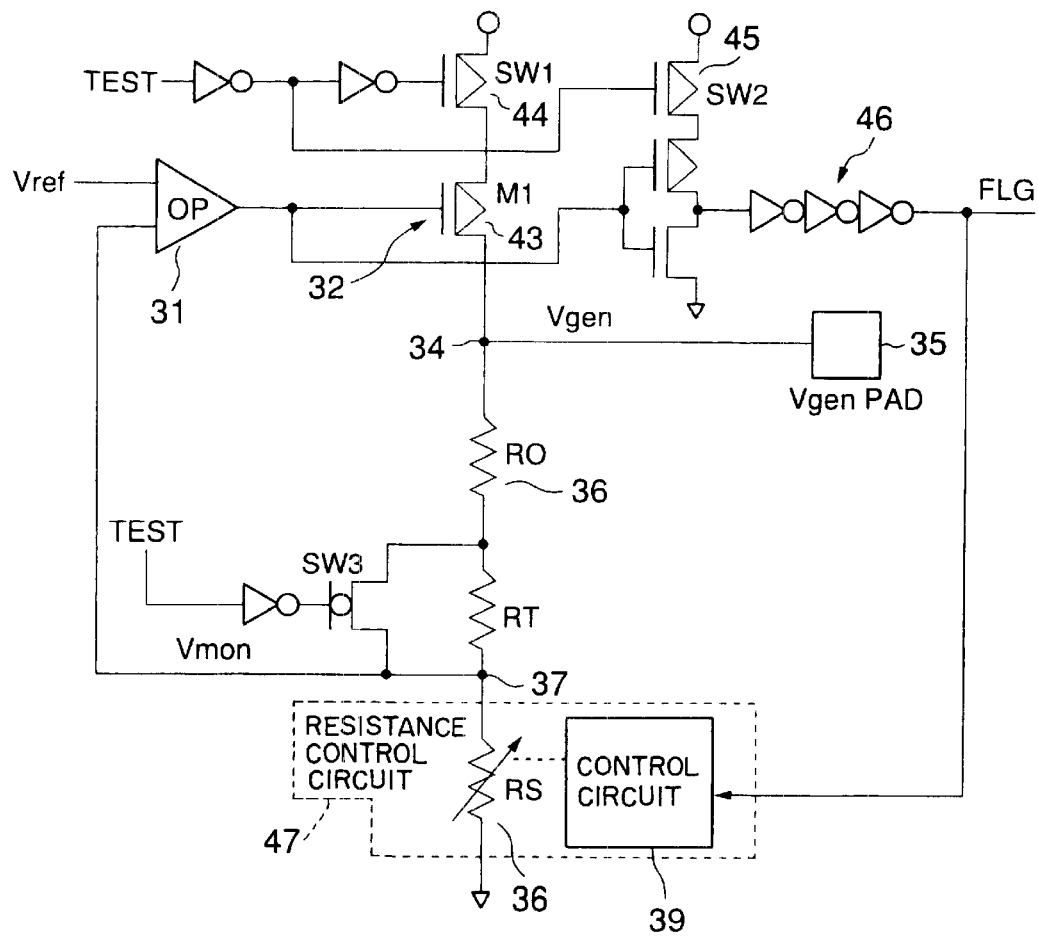
FIG. 34 is a circuit block diagram of the seventeenth preferred embodiment of a semiconductor integrated circuit according to the present invention.

While the resistor provided between the nodes 34 and 37 has been the variable resistor RS and the resistor provided between the node 37 and the ground has been the resistor RO having a fixed value of resistance in the above described tenth through fifteenth preferred embodiments, the present invention should not be limited thereto. As the sixteenth preferred embodiment of a semiconductor integrated circuit according to the present invention shown in FIG. 33 and the seventeenth preferred embodiment of a semiconductor integrated circuit according to the present invention shown in FIG. 34, the resistor provided between the node 37 and the ground may be a variable resistor RS, and the other resistor may be a resistor RO having a fixedalue of resistance.

The sixteenth and seventeenth preferred embodiments correspond to the circuits in the tenth and thirteenth preferred embodiments shown in FIGS. 22 and 30, respectively. Also with respect to the eleventh, twelfth, fourteenth and fifteenth preferred embodiments, a limiter circuit wherein a variable resistor RS and a fixed resistor RO are replaced may be applied similar to the sixth and seventh preferred embodiments.

(Eighteenth Preferred Embodiment)

It has been described that combinations of the first and second basic constructions of a semiconductor integrated circuit according to the present invention can also include the concept of the present invention. As such a preferred embodiment, there is the eighteenth preferred embodiment of a semiconductor integrated circuit according to the present invention shown in FIG. 35.

The eighteenth preferred embodiment of a semiconductor integrated circuit according to the present invention shown in FIG. 35 has a modified construction wherein the monitoring circuit 24 in the second preferred embodiment of a semiconductor integrated circuit according to the present invention shown in FIG. 8, and the twelfth preferred embodiment of a semiconductor integrated circuit 60 according to the present invention shown in FIG. 28 are modified. In FIG. 35, the semiconductor integrated circuit in the eighteenth preferred embodiment comprises an internal voltage limiter circuit 64 and a monitoring circuit 24. Since the construction of the monitoring circuit 24 is the same as that of the monitoring circuit 24 in the second preferred embodiment described referring to FIG. 8, the same reference numbers are given to the same elements to omit the duplicate descriptions thereof.

The construction of the internal voltage limiter circuit 64 is obtained by modifying the construction of the semiconductor integrated circuit in the twelfth preferred embodiment shown in FIG. 28. The difference is that a mode signal is supplied to a NOR gate G1 to be compared with the output of a comparing part 31 to derive a NOR logical output which is supplied to a control circuit 39 and an oscillator circuit 61. Other constructions of the limiter circuit 64 are the same as those in the twelfth preferred embodiment of a semiconductor integrated circuit according to the present invention shown in FIG. 28.

According to the eighteenth preferred embodiment of a semiconductor integrated circuit according to the present invention shown in FIG. 35, it is possible to simultaneously provide the construction capable of simply monitoring the output voltage state of an internal power supply circuit by an external terminal in the first basic construction of a semiconductor integrated circuit according to the present invention, and the construction capable of carrying out a voltage trimming by reading a limiter flag in the second basic construction of a semiconductor integrated circuit according to the present invention. Also in the eighteenth preferred embodiment, the resistor element 36 may have a construction wherein the variable resistor is replaced with the fixed resistor.

(Nineteenth Preferred Embodiment)

While the semiconductor integrated circuits in the above described ninth through eighteenth preferred embodiments have had a concrete circuit construction in order to realize the voltage trimming function, the voltage trimming function may be realized by a functional construction as the third basic construction of a semiconductor integrated circuit according to the present invention. The nineteenth preferred embodiment of a semiconductor integrated circuit according to the present invention shown in FIG. 36 corresponds to the third basic construction of a semiconductor integrated circuit according to the present invention.

In FIG. 36, an internal voltage limiter circuit 65 of the semiconductor integrated circuit in the nineteenth preferred embodiment comprises: a comparator circuit 66 for comparing a reference voltage, which is supplied from, e.g., a reference voltage generating circuit (not shown in FIG. 36), with the potential in the circuit; an internal voltage generating circuit 67 for generating an internal voltage by the comparison of the comparator 66; a fine control circuit 68 for fine-controlling the value of the internal voltage by bit data based on a flag signal FLG which is outputted from the comparator circuit 66; an external terminal (Vgen PAD) 35 for supplying a first voltage to an output node of the internal voltage generating circuit 67 from the outside during a test; and a voltage ratio controller 69 for controlling a voltage ratio of the internal voltage value to the reference voltage and a voltage ratio of the first voltage to the reference voltage.

In the internal voltage limiter circuit 65 with the above described construction, the fine control circuit 68 can detect bit data on the basis of the voltage ratio of the first voltage, which is inputted from the external terminal during a test, to the reference voltage. Using the bit data to control the voltage ratio of the reference voltage to the internal voltage during an operation other than the test by means of the voltage ratio controller 69, a generated internal voltage approximates the first voltage within an error range determined by the resolution of bit data. Thus, the bit data obtained during the test can be used for fine-controlling the internal voltage during a usual operation, and it is possible to remove the dispersion in circuits by using the same circuit in the usual and test operations.

As described above, according to the present invention, the monitoring circuit for outputting a monitoring signal, which has a constant logical level after the timing in stabilizing the output of the internal power supply circuit, is added to the internal power supply circuit, so that it is possible to more simply confirm the stabilization of the output of the internal power supply circuit.

In the semiconductor integrated circuit having voltage trimming function according to the present invention, a voltage intended to be set in the voltage monitoring pad is given from the outside to carry out a voltage trimming by the deactivation of the feedback system of the limiter circuit, the operation of the value of resistance of the limiter, and the readout of the limiter flag. In the semiconductor integrated circuit according to the present invention, most of circuit systems of the voltage generating circuit are used for setting the value of resistance closest to the voltage intended to be set, so that it is possible to carry out a trimming while including dispersion. Since the determination of resistance bit data for setting the value of resistance is carried out in the internal circuit, it is possible to measure a plurality of chips, so that it is possible to greatly shorten the test time.

What is claimed is:

1. A semiconductor integrated circuit having an internal monitoring function, said semiconductor integrated circuit comprising:

an internal power supply circuit to generate a driving voltage which is obtained by shifting the level of a power supply voltage;

a limiter circuit, which is operated by the input of a mode signal, to monitor said driving voltage which is outputted from said internal power supply circuit, and to output an activating signal which has a first logical level until said driving voltage reaches a predetermined value and which has a second logical level after said driving voltage reaches said predetermined value, so as to activate and control said internal power supply circuit; and a monitoring circuit to detect a first change of said activating signal from said first logical level to said second logical level after the operation of said limiter circuit is started, and to output a monitoring signal having a constant logical level while said limiter circuit operates after said first change of said activating signal is detected, wherein said monitoring circuit is activated in a test mode, and said monitoring signal is transferred and outputted to a first external terminal, and wherein said monitoring circuit comprises: a comparator, to which an external power supply voltage supplied from a second external terminal is given and which is activated in said test mode, to compare to voltage of a monitoring node which is provided for monitoring said driving voltage of said internal power supply circuit, with a reference voltage which is supplied from a third external terminal, and to output said monitoring signal; and a transfer gate to transfer said monitoring signal, which is outputted from said comparator, to said first external terminal.

2. A semiconductor integrated circuit as set forth in claim 1, wherein said reference voltage supplied from said third external terminal is a voltage, the level of which varies with the elapse of time so as to cross a voltage value which is to be monitored by said monitoring node.

3. A semiconductor integrated circuit as set forth in claim 1, wherein a transfer gate driven by a boosted voltage is provided in a path for supplying said external power supply voltage from said second external to said comparator.

4. A semiconductor integrated circuit as set forth in claim 1, wherein a transfer gate driven by said external power supply voltage or a voltage boosted therein is provided in a path for supplying a reference voltage from said third external terminal to said comparator.

5. A semiconductor integrated circuit having an internal monitoring function, said semiconductor integrated circuit comprising:

an internal power supply circuit to generate a driving voltage which is obtained by shifting the level of a power supply voltage;

a limiter circuit, which is operated by the input of a mode signal, to monitor said driving voltage which is outputted from said internal power supply circuit, and to output an activating signal which has a first logical level until said driving voltage reaches a predetermined value and which has a second logical level after said driving voltage reaches said predetermined value, so as to activate and control said internal power supply circuit; and a monitoring circuit to detect a first change of said activating signal from said first logical level to said second logical level after the operation of said limiter circuit is started, and to output a monitoring signal having a constant logical level while said limiter circuit operates after said first change of said activating signal is detected, wherein said monitoring circuit is activated in a test mode, and said monitoring signal is transferred and outputted to a first external terminal, and wherein said monitoring circuit comprises: a comparator, to which an external power supply voltage supplied from a second external terminal is given and which is activated in said test mode, to compare to voltage of a monitoring node which is provided for monitoring said driving voltage of said internal power supply circuit, with a reference voltage which is obtained by potential-driving said external power supply voltage, and to output said monitoring signal; and a transfer gate to transfer said monitoring signal, which is outputted from said comparator, to said first external terminal.

6. A semiconductor integrated circuit as set forth in claim 5, wherein said external power supply voltage supplied from said second external terminal is a voltage, the level of which varies with the elapse of time so that said reference voltage crosses a voltage value which is to be monitored by said monitoring node.

7. A semiconductor integrated circuit as set forth in claim 5, wherein a transfer gate driven by a boosted voltage is provided in a path for supplying said external power supply voltage from said second external terminal to said comparator.

8. A semiconductor integrated circuit having an internal monitoring function, said semiconductor integrated circuit comprising:

an internal power supply circuit to generate a driving voltage is obtained by shifting the level of a power supply voltage;

a limiter circuit, which is operated by the input of a mode signal, to monitor said driving voltage which is outputted from said internal power supply circuit, and to output an activating signal which has a first logical level until said driving voltage reaches a predetermined value and which has a second logical level after said driving voltage reaches said predetermined value, so as to activate and control said internal power supply circuit; and a monitoring circuit to detect a first change of said activating signal from said first logical level to said second logical level after the operation of said limiter circuit is started, and to output a monitoring signal having a constant logical level while said limiter circuit operates after said first change of said activating signal is detected, wherein said monitoring circuit is activated in a test mode, and said monitoring signal is transferred and outputted to a first external terminal, and wherein said monitoring circuit comprises: a comparator, activated in said test mode, to compare a voltage of a monitoring node which is provided for monitoring said driving voltage of said internal power supply circuit, with a reference voltage which is supplied from a third external terminal, and to output said monitoring signal; and a transfer gate to transfer said monitoring signal, which is outputted from said comparator, to said first external terminal.

9. A semiconductor integrated circuit as set forth in claim 8, wherein said reference voltage supplied from said third external is a voltage, the level of which varies with the elapse of time so as to cross a voltage value which is to be monitored by said monitoring node.

10. A semiconductor integrated circuit as set forth in claim 8, wherein a transfer gate driven by an external power supply voltage or a voltage boosted therein is provided in a path for supplying a reference voltage from said third external terminal to said comparator.

* * * * *